(12) United States Patent
Noma et al.

(10) Patent No.: US 7,969,007 B2
(45) Date of Patent: Jun. 28, 2011

(54) SEMICONDUCTOR DEVICE AND MANUFACTURING METHOD THEREOF

(75) Inventors: Takashi Noma, Gunma (JP); Hiroyuki Shinogi, Gunma (JP); Noboru Okubo, Saitama (JP)

(73) Assignees: Sanyo Electric Co., Ltd., Moriguchi-shi (JP); Sanyo Semiconductor Co., Ltd., Gunma (JP)

( * ) Notice: Subject to any disclaimer, the term of this patent is extended or adjusted under 35 U.S.C. 154(b) by 518 days.

(21) Appl. No.: 12/111,383

(22) Filed: Apr. 29, 2008

(65) Prior Publication Data
US 2008/0277793 A1 Nov. 13, 2008

(30) Foreign Application Priority Data

May 7, 2007 (JP) ................................. 2007-122753
May 30, 2007 (JP) ................................. 2007-143965

(51) Int. Cl.
*H01L 23/485* (2006.01)
(52) U.S. Cl. .......... 257/758; 257/E23.019; 257/E23.069
(58) Field of Classification Search ........... 257/E23.142, 257/E23.019, 758
See application file for complete search history.

(56) References Cited

U.S. PATENT DOCUMENTS 7,102,238 B2 *   9/2006   Noma et al. ................... 257/777
2004/0235270 A1 *  11/2004   Noma et al. ................... 438/460

FOREIGN PATENT DOCUMENTS

JP   2006-093367   4/2006

\* cited by examiner

*Primary Examiner* — Benjamin P Sandvik
*Assistant Examiner* — Krista Soderholm
(74) *Attorney, Agent, or Firm* — Morrison & Foerster LLP

(57) ABSTRACT

A semiconductor device with improved moisture resistance and its manufacturing method as well as a manufacturing method of a semiconductor device which simplifies a manufacturing process and improves productivity are offered. This invention offers a CSP type semiconductor device and its manufacturing method that can prevent moisture and the like from infiltrating into it to attain high reliability by covering a side surface of a semiconductor chip with a thick protection layer. This invention also offers a highly productive manufacturing method of semiconductor devices by which a supporter bonded to semiconductor dice is etched from a back surface-side of the supporter so that the semiconductor devices can be separated without dicing.

6 Claims, 19 Drawing Sheets

SEMICONDUCTOR DEVICE AND MANUFACTURING METHOD THEREOF

CROSS-REFERENCE OF THE INVENTION

This application claims priority from Japanese Patent Application Nos. 2007-122753 and 2007-143965, the contents of which are incorporated herein by reference in their entireties.

BACKGROUND OF THE INVENTION

1. Field of the Invention

This invention relates to a semiconductor device and its manufacturing method, specifically to a CSP (Chip Size Package) type semiconductor device using a supporter and its manufacturing method.

2. Description of the Related Art

A CSP has received attention in recent years as a new packaging technology. The CSP denotes a small package having about the same outside dimensions as those of a semiconductor die packaged in it. A BGA (Ball Grid Array) type semiconductor device has been known as a kind of CSP. A plurality of ball-shaped terminals made of metallic material such as solder is arrayed on one of surfaces of the BGA type semiconductor device.

In order to increase packaging density, reducing a thickness of the semiconductor die is required, which in turn requires reducing a thickness of a semiconductor substrate as well. When the thickness of the semiconductor substrate is reduced, however, carrying the semiconductor substrate becomes impossible since reduced strength of the substrate causes warping and fracturing of the substrate during the manufacturing process. Therefore, it has been practiced that a supporter such as a glass substrate or a protection tape is bonded to one of surfaces of the semiconductor substrate and the semiconductor substrate is reduced in thickness by grinding the other surface of the semiconductor substrate to which the supporter is not bonded.

FIG. 29 is a cross-sectional view showing an outline of a conventional BGA type semiconductor device with the supporter. A semiconductor integrated circuit 101 made of elements such as CCD (Charge Coupled Device) type image sensors and CMOS type image sensors is formed in a surface of a semiconductor substrate 100 made of silicon (Si) or the like. Pad electrodes 102 that are electrically connected with the semiconductor integrated circuit 101 are formed on an insulation film 103 that is formed on the surface of the semiconductor substrate 100. The pad electrodes 102 are covered with a passivation film 104 made of a silicon nitride film or the like.

A supporter 105 made of a glass substrate or the like is bonded to the surface of the semiconductor substrate 100 through an adhesive layer 106 made of epoxy resin or the like. The supporter 105 is thick enough to firmly support the semiconductor substrate 100 that is to be reduced in thickness during the manufacturing process and to prevent the supporter 105 from being warped or fractured. For example, when the thickness of the semiconductor substrate 100 is to be reduced to about 100 μm, a thickness of the supporter is about 400 μm.

An insulation film 107 made of a silicon oxide film, a silicon nitride film or the like is formed on a side surface and a back surface of the semiconductor substrate 100. Wiring layers 108 each electrically connected with corresponding each of the pad electrodes 102 are formed on the insulation film 107 along the side surface and the back surface of the semiconductor substrate 100. A protection layer 109 made of solder resist or the like is formed to cover the insulation film 107 and the wiring layers 108. Openings are formed in the protection film 109 at predetermined regions on the wiring layers 108. There are formed ball-shaped conductive terminals 110, each connected with corresponding each of the wiring layers 108 through corresponding each of the openings, respectively.

The semiconductor device described above is manufactured through a process including a process step (so-called dicing process) in which the supporter 105, the protection film 109 and the like are cut with a dicing blade along predetermined dicing lines DL that make borders between individual semiconductor devices.

The technology mentioned above is disclosed in Japanese Patent Application Publication No. 2006-93367, for example.

Although the semiconductor device described above has the protection film 109 that covers the wiring layers 108 connected with the pad electrodes 102, poor moisture resistance of the protection film 109 and the adhesive layer 106 made of hygroscopic material at a contacting portion with the supporter 105 or the like causes a problem of reliability that the supporter 105 comes unstuck from the semiconductor substrate 100.

The number of dicing lines DL has increased as microfabrication has advanced to increase the number of dice per wafer. The conventional manufacturing method in which the dicing is carried out along each of the dicing lines DL at a time causes another problem that the dicing process takes a lot of time. In particular, when a highly rigid material such as a glass substrate is used as the supporter 105, difficulty to cut the supporter 105 makes additional reason to extend time required in the dicing process. In addition, electronic equipment has been required incorporating more functions while reducing its thickness.

This invention is directed to offering a semiconductor device with high reliability and a manufacturing method of the semiconductor device that is simplified to enhance productivity, as well as reducing a thickness of the semiconductor device.

SUMMARY OF THE INVENTION

This invention is directed to solve the problems addressed above and has following features. This invention offers a semiconductor device having a metal pad formed in a vicinity of a side surface of a semiconductor die and connected with a circuit element in the semiconductor die, an insulation film formed on the side surface and a back surface of the semiconductor die, a metal wiring connected with a back surface of the metal pad and disposed on the insulation film over the side surface and the back surface of the semiconductor die, a protection layer formed to fill a space over the side surface and the back surface of the semiconductor die and a conductive terminal connected with the metal wiring through an opening formed in the protection layer.

This invention also offers the semiconductor device wherein the protection layer is composed of a first protection layer and a second protection layer.

This invention also offers the semiconductor device further having a supporter that is bonded to the semiconductor die so as to cover a surface of the semiconductor die and the metal pad.

This invention also offers a semiconductor device composed of a first semiconductor device having a metal pad formed in a vicinity of a side surface of a semiconductor die and connected with a circuit element in the semiconductor die, an insulation film formed on the side surface and a back surface of the semiconductor die, a metal wiring connected with a back surface of the metal pad and disposed on the insulation film over the side surface and the back surface of the semiconductor die, a protection layer formed to fill a space over the side surface and the back surface of the semiconductor die and a conductive terminal connected with the metal wiring through an opening formed in the protection layer and a second semiconductor device structured in the same way as the first semiconductor device, wherein the second semiconductor device is disposed on the first semiconductor device and the protection layer of the second semiconductor device makes contact with the first semiconductor device.

This invention also offers a semiconductor device having a metal pad formed in a vicinity of a side surface of a semiconductor die and connected with a circuit element in the semiconductor die, an insulation film formed on the side surface and a back surface of the semiconductor die, a metal wiring connected with a back surface of the metal pad and disposed on the insulation film over the side surface and the back surface of the semiconductor die, a protection layer formed over the side surface and the back surface of the semiconductor die, a conductive terminal connected with the metal wiring through an opening formed in the protection layer and a conductive film disposed on the protection layer so as to fill a space over the side surface of the semiconductor die.

This invention also offers the semiconductor device described above having a supporter that is bonded to the semiconductor die so as to cover a surface of the semiconductor die and the metal pad.

This invention also offers a manufacturing method of a semiconductor device including providing a semiconductor substrate on which a metal pad is formed through a first insulation film, bonding a surface of a supporter to a surface of the semiconductor substrate and the metal pad, removing a portion of the semiconductor substrate from its back surface-side to expose the first insulation film, forming a second insulation film all over the back surface of the semiconductor substrate, removing a portion of the first and second insulation films to expose the metal pad, forming a metal wiring connected with a back surface of the metal pad and extending over the back surface of the semiconductor substrate, forming a groove in the surface of the supporter extending partway through a thickness of the supporter, forming a protection layer so as to fill a space over the back surface of the semiconductor substrate and the groove, and forming a conductive terminal electrically connected with the metal wiring through an opening formed in the protection layer.

This invention also offers the manufacturing method of the semiconductor device, wherein the forming of the protection layer includes forming a first protection layer and forming a second protection layer on the first protection layer.

This invention also offers a manufacturing method of a semiconductor device including providing a semiconductor substrate on which a metal pad is formed through a first insulation film, bonding a surface of a supporter to a surface of the semiconductor substrate and the metal pad, removing a portion of the semiconductor substrate from its back surface-side to expose the first insulation film, forming a second insulation film all over the back surface of the semiconductor substrate, removing a portion of the first and second insulation films to expose the metal pad, forming a metal wiring connected with a back surface of the metal pad and extending over the back surface of the semiconductor substrate, forming a groove in the surface of the supporter extending partway through a thickness of the supporter, forming a first protection layer over the back surface of the semiconductor substrate and the groove, forming a conductive terminal electrically connected with the metal wiring through an opening formed in the first protection layer, and forming a second protection layer on the first protection layer.

This invention also offers the manufacturing method of the semiconductor device, wherein the forming of the protection layer includes applying a mold resin.

This invention also offers the manufacturing method of the semiconductor device, wherein the forming of the protection layer includes applying a conductive material.

This invention also offers the manufacturing method of the semiconductor device, further including reducing the thickness of the supporter.

This invention also offers the manufacturing method of the semiconductor device, further including removing the supporter.

This invention offers a manufacturing method of a semiconductor device, including bonding a surface of a supporter to a surface of a semiconductor substrate in a wafer form, removing a portion of the semiconductor substrate, forming a groove in the surface of the supporter extending partway through a thickness of the supporter, dividing the supporter to obtain individual semiconductor devices by etching the supporter from its back surface until the groove is exposed.

This invention also offers a manufacturing method of a semiconductor device including bonding a tape to a surface of a semiconductor substrate in a wafer form, bonding a surface of a supporter to the tape, removing a portion of the semiconductor substrate, forming a groove in a surface of the tape facing the semiconductor substrate extending partway through a thickness of the tape, forming a protection layer over a side surface and a back surface of the semiconductor substrate having an opening at a location corresponding to the groove, etching the supporter from its back surface until the tape is exposed, dividing the semiconductor substrate and the supporter to obtain individual semiconductor devices by providing a solvent to the exposed tape to unstick the tape from the semiconductor substrate.

This invention also offers a manufacturing method of a semiconductor device including bonding a surface of a supporter to a surface of a semiconductor substrate in a wafer form, removing a portion of the semiconductor substrate, forming a groove in the surface of the supporter extending partway through a thickness of the supporter, reducing the thickness of the supporter at a location corresponding to the groove by etching a back surface of the supporter at least at the location corresponding to the groove, and dividing the supporter along the groove to obtain individual semiconductor devices by applying a load to the supporter.

DETAILED DESCRIPTION OF THE INVENTION

Figure 1:
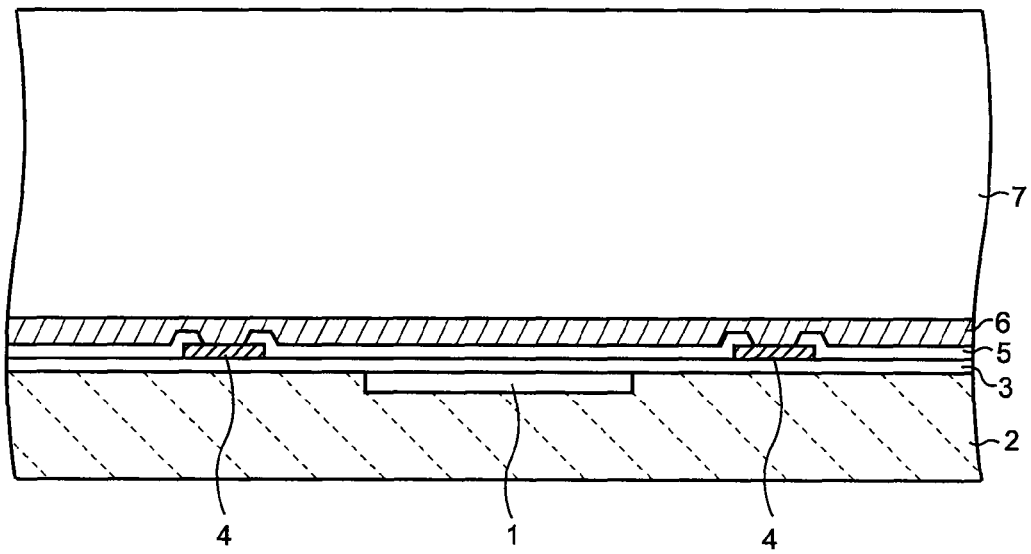
FIG. 1 is a cross-sectional view showing a manufacturing method of a semiconductor device according to a first embodiment of this invention.

A semiconductor device according to a first embodiment of this invention will be explained hereafter referring to the drawings. FIG. 1 through FIG. 8 are cross-sectional views and plan views of the semiconductor device presented in an order of a manufacturing process. Although the manufacturing process is applied to a semiconductor substrate in wafer form in which a plurality of the semiconductor devices is arrayed in a matrix bordered with predetermined dicing lines DL, the manufacturing process to form one of the semiconductor devices is described hereafter for the simplicity of explanation.

First, there is provided a semiconductor substrate 2 in wafer form made of silicon (Si) or the like, in a surface of which a semiconductor integrated circuit 1 (a driver circuit or a logic circuit structured by integrating light-receiving elements such as CCD sensors, CMOS sensors or illumination sensors, light-emitting elements, and semiconductor elements such as transistors and interconnections, for example) is formed, as shown in FIG. 1. The semiconductor substrate 2 is about 300-700 µm thick, for example. An insulation film 3 (a silicon oxide film formed by thermal oxidation or CVD, for example) of a thickness of 2 µm, for example, is formed on the surface of the semiconductor substrate 2.

After a metal layer made of aluminum (Al), aluminum alloy or copper (Cu), for example, is formed by sputtering, plating or other film forming method, the metal layer is etched using a resist layer (not shown) as a mask to form pad electrodes 4 of a thickness of 1 µm, for example, on the insulation film 3. The pad electrodes 4 make electrodes for external connections, which are electrically connected with the semiconductor integrated circuit 1 or its peripheral components through interconnections (not shown). A power supply voltage, a ground voltage, and various kinds of signals are provided from conductive terminals 14, which are to be described, to the semiconductor integrated circuit 1, the semiconductor substrate 2 and the like through the pad electrodes 4. There is no restriction on a location where the pad electrode 4 is placed, and the pad electrode 4 may be placed above the semiconductor integrated circuit 1.

Next, a passivation film 5 (a silicon nitride film formed by CVD, for example) that covers a portion of or all the pad electrode 4 is formed over the surface of the semiconductor substrate 2. The passivation film 5 shown in FIG. 1 is formed to cover a portion of the pad electrode 4.

Next, a supporter 7 in wafer form is bonded to the surface of the semiconductor substrate 2 and the pad electrode 4 through an adhesive layer 6 made of epoxy resin, polyimide (photosensitive polyimide, for example), resist, acryl or the like. In this embodiment, a surface of the supporter 7 facing the semiconductor substrate 2 is denoted as a top surface while the other surface of the supporter 7 is denoted as a back surface. When the semiconductor integrated circuit 1 includes a light-receiving element or a light-emitting element, it is preferable that the adhesive layer 6 is made of transparent material with a high light transmittance since emitted light from the semiconductor integrated circuit 1 or incident light to the semiconductor integrated circuit 1 travels through the adhesive layer 6.

The supporter 7 may be a film-shaped protection tape, may be a rigid substrate made of glass, silicon, quartz, ceramics, plastics, metal or the like, or may be made of resin. The supporter 7 serves to bolster the semiconductor substrate 2 as well as protecting a surface of elements in the semiconductor substrate 2, and its thickness is about 400 µm, for example. When the semiconductor integrated circuit 1 includes a light-receiving element or a light-emitting element, the supporter 7 is to be made of transparent or semitransparent material to permit the light to pass through.

Next, back grinding using a back surface grinder is applied to a back surface of the semiconductor substrate 2 so as to reduce the thickness of the semiconductor substrate 2 to a predetermined thickness (100 µm, for example). The back grinding may be replaced with etching, or with a combination of grinding and etching. The back grinding might not be required, depending on usage or specifications of the final product or an initial thickness of the semiconductor substrate 2 being provided.

Figure 2:
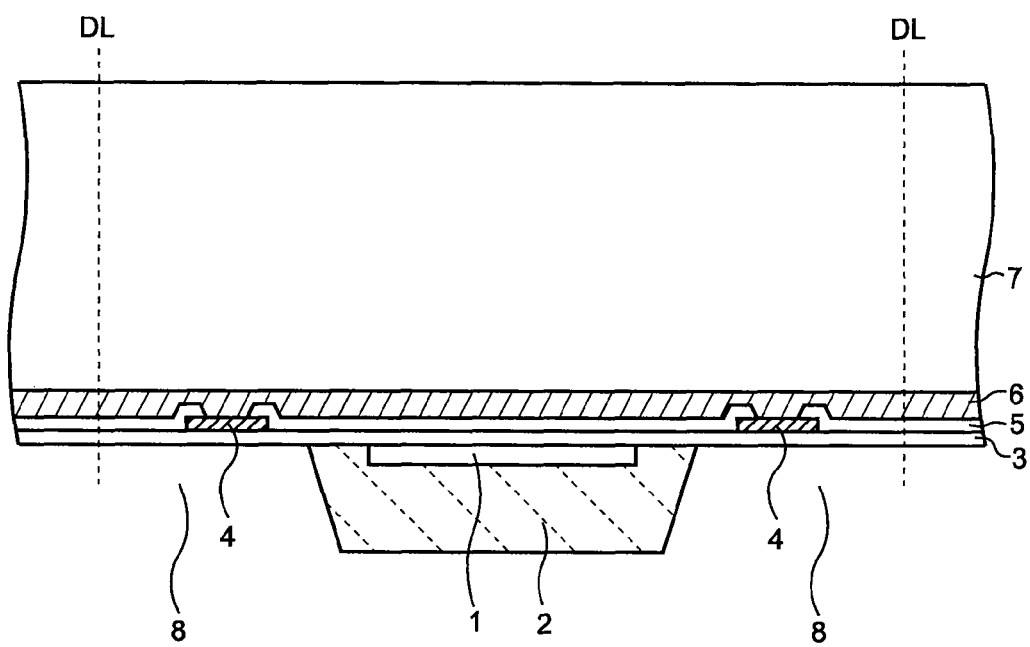
FIG. 2 is a cross-sectional view showing the manufacturing method of the semiconductor device according to the first embodiment of this invention.

Next, predetermined regions of the semiconductor substrate 2, which correspond to the pad electrodes 4, are selectively etched off from the back surface-side of the semiconductor substrate 2 to expose portions of the insulation film 3, as shown in FIG. 2. The exposed portions are hereafter referred to as openings 8. The openings 8 are formed in a grating pattern turning the semiconductor substrate 2 in wafer form into divided islands, as shown in FIGS. 3A and 3B.

Figure 3A:
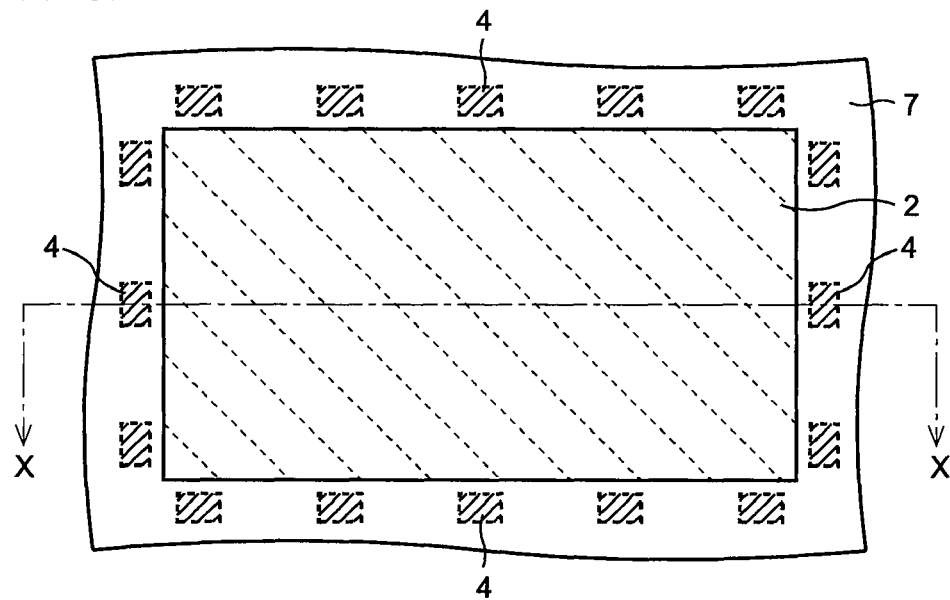
FIGS. 3A and 3B are plan views showing the manufacturing method of the semiconductor device according the first embodiment of this invention.
Figure 3B:
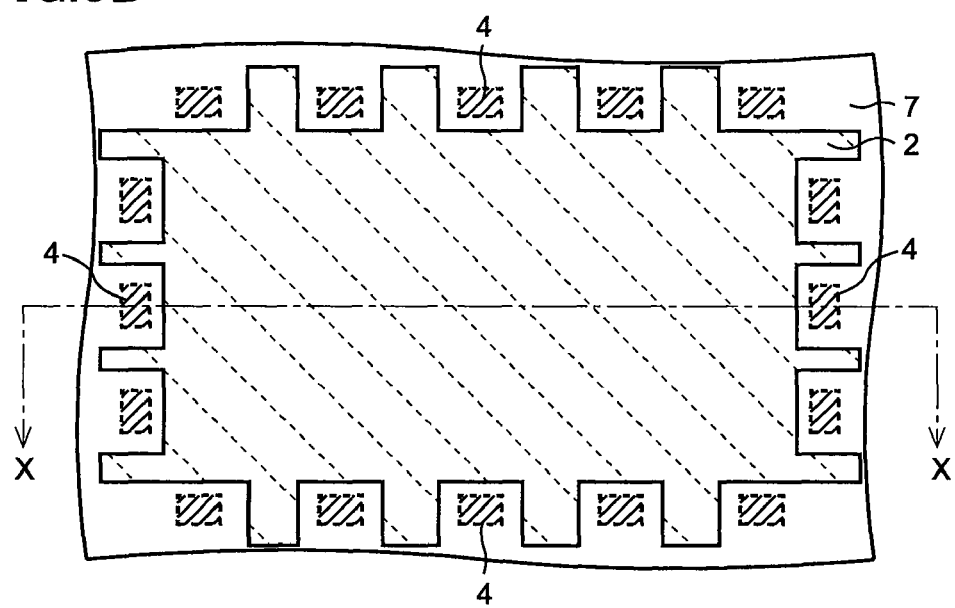

The selective etching of the semiconductor substrate 2 is hereafter explained referring to FIGS. 3A and 3B. FIGS. 3A and 3B are outline plan views seen from a side of the semiconductor substrate 2. FIG. 2 corresponds to a cross-sectional view of a section X-X shown in FIGS. 3A and 3B.

The semiconductor substrate 2 may be etched to a shape of a rectangle narrower in width than the supporter 7, as shown in FIG. 3A. Or, the semiconductor substrate 2 may be shaped to have a rugged periphery by etching off portions of the semiconductor substrate 2 in regions above which the pad electrodes 4 are formed, as shown in FIG. 3B. The latter structure has larger overlapping area between the semiconductor substrate 2 and the supporter 7 and leaves the semiconductor substrate 2 extended closer to a periphery of the supporter 7 than the former structure. Therefore, the latter structure is more preferable than the former structure from the standpoint of enhancing the strength of the supporter 7 to bolster the semiconductor substrate 2. Also, warping of the supporter 7 due to a difference in a coefficient of thermal expansion between the semiconductor substrate 2 and the supporter 7 can be prevented with the latter structure, thus cracks in the semiconductor device and separation of the semiconductor substrate 2 from the supporter 7 can be prevented. It is also possible to design the semiconductor substrate 2 in a planar shape that is different from both of the shapes shown in FIGS. 3A and 3B. The rest of the manufacturing process is described for the case in which the semiconductor substrate 2 is etched to the shape shown in FIG. 3A.

The semiconductor substrate 2 is etched in a way that sidewalls of the semiconductor substrate 2 are tapered down toward the back surface of the semiconductor substrate 2 in this embodiment. However, the semiconductor substrate 2 may also be etched in a way that the sidewalls of the semiconductor substrate 2 are perpendicular to a principal surface of the supporter 7 to keep a width of the semiconductor substrate 2 constant.

Figure 4:
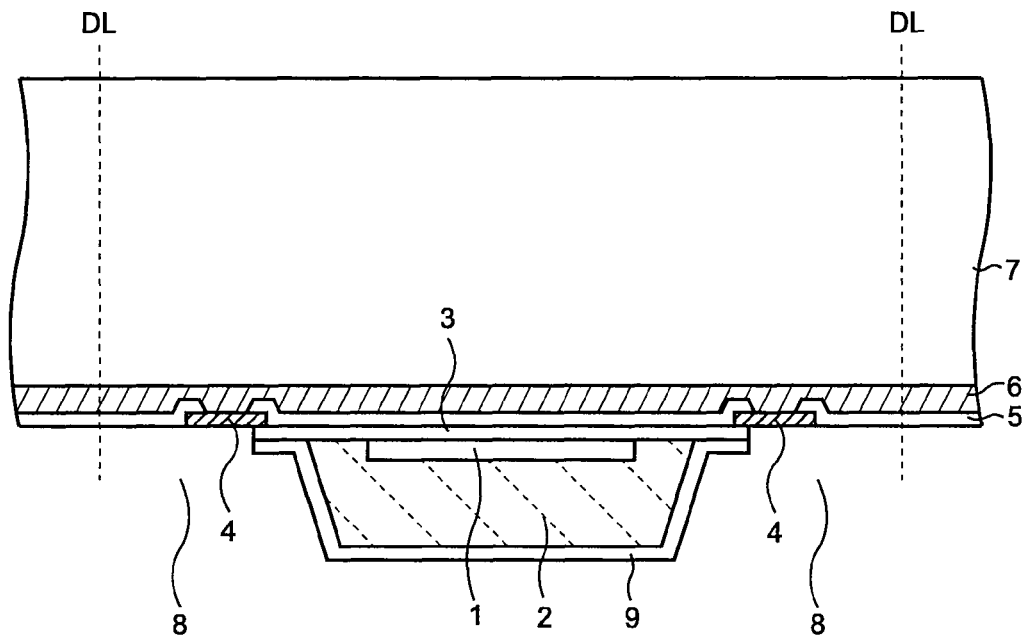
FIG. 4 is a cross-sectional view showing the manufacturing method of the semiconductor device according to the first embodiment of this invention.

Next, an insulation film 9 such as a silicon oxide film or a silicon nitride film is formed by plasma CVD or the like over the side surface and the back surface of the semiconductor substrate 2 and the opening 8. Next, the insulation film 3 and the insulation film 9 are selectively etched using a resist layer (not shown) as a mask, as shown in FIG. 4. The insulation film 3 and the insulation film 9 formed over a region stretching from a portion of the pad electrode 4 to the dicing line DL are selectively removed by the etching so that the portion of the pad electrode 4 is exposed at the bottom of the opening 8.

Figure 5:
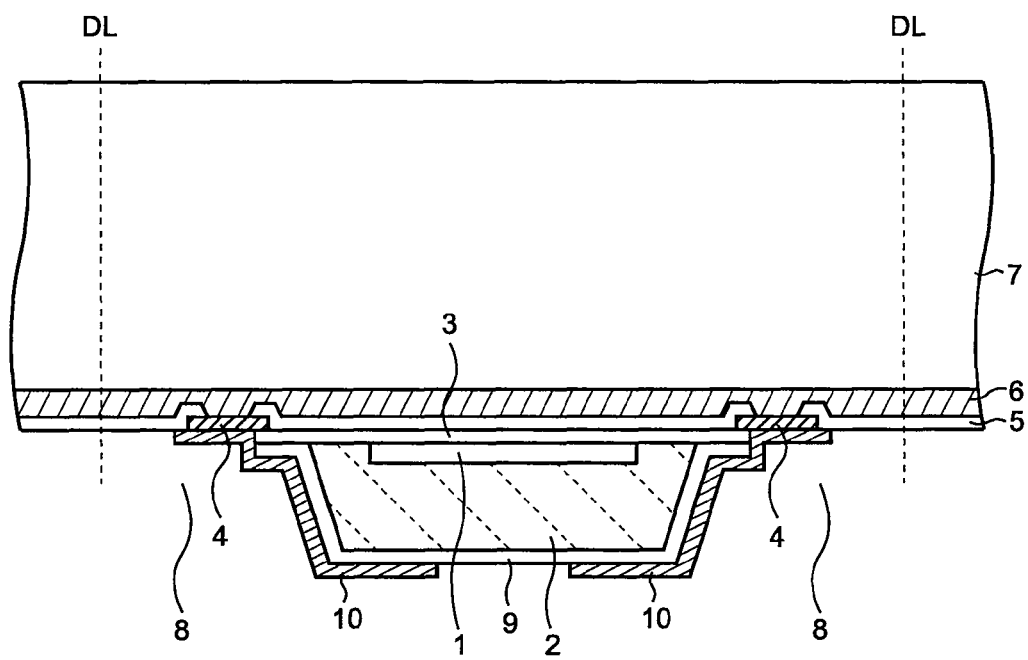
FIG. 5 is a cross-sectional view showing the manufacturing method of the semiconductor device according the first embodiment of this invention.

Next, a metal layer to make a wiring layer 10 made of aluminum (Al), copper (Cu) or the like is formed by a film forming method such as sputtering or plating. After that, the metal layer is selectively etched using a resist layer (not shown) as a mask. The etching shapes the metal layer into the wiring layer 10 that is formed on the side surface and the back surface of the semiconductor substrate 2 and connected with the pad electrode 4, as shown in FIG. 5.

Next, an electrode connection layer (not shown, made of stacked layers of nickel and gold, for example) is formed on a predetermined region of the wiring layer 10. The electrode connection layer is formed because the wiring layer 10 made of aluminum or the like is not easily bonded to the conductive terminal 14 made of solder or the like and because the electrode connection layer prevents a material forming the conductive terminal 14 from flowing out of the predetermined region of the wiring layer 10. The electrode connection layer may be formed after a protection layer 13 is formed.

Figure 6:
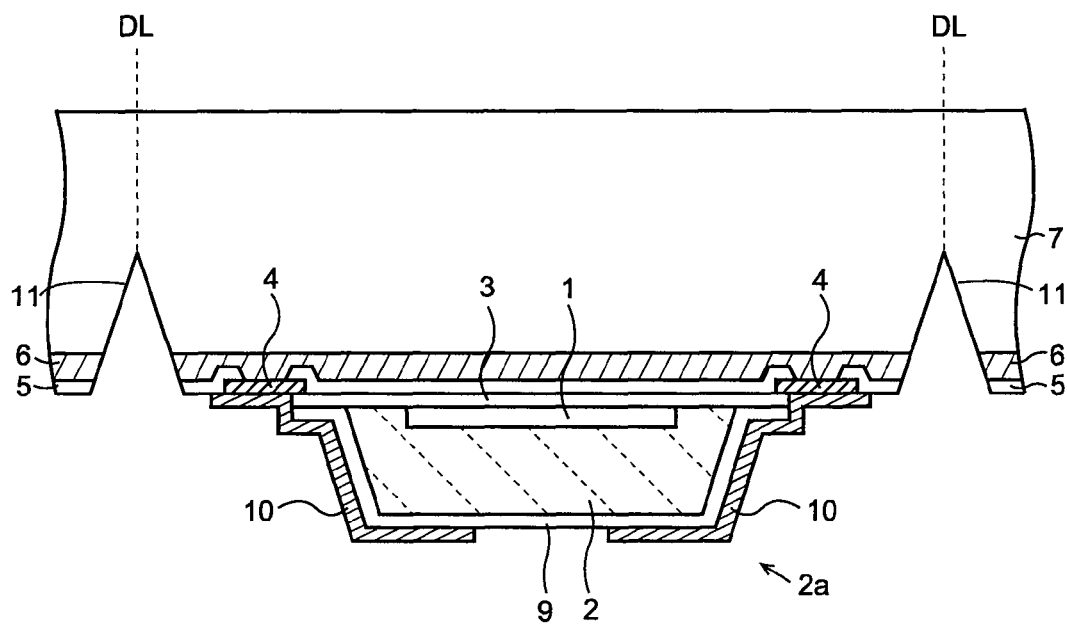
FIG. 6 is a cross-sectional view showing the manufacturing method of the semiconductor device according the first embodiment of this invention.

Next, a groove 11 reaching partway through the thickness of the supporter 7 is formed by removing a portion of the passivation film 5, the adhesive layer 6 and the surface of the supporter 7 with a dicing blade or by dry etching, as shown in FIG. 6. A large number of grooves 11 are formed in rows and columns in the surface of the supporter 7 along borders (dicing lines DL) between the individual semiconductor devices. With this, the semiconductor substrate 2 is divided into semiconductor dice 2a. The explanation is hereafter given on the semiconductor die 2a.

Although a cross-sectional shape of the groove 11 is not limited to a V-shape as shown in FIG. 6 and may be other shape such as an ellipse or a rectangle as long as a side surface of the adhesive layer 6 is exposed, it is preferable that the cross-sectional shape of the groove 11 is the V-shape or a shape that is bent outwardly at its upper portion (a portion close to a surface of the semiconductor die 2a) from a standpoint of attaining better coverage of the groove 11 with the protection layer 13 which is to be described below.

Figure 7:
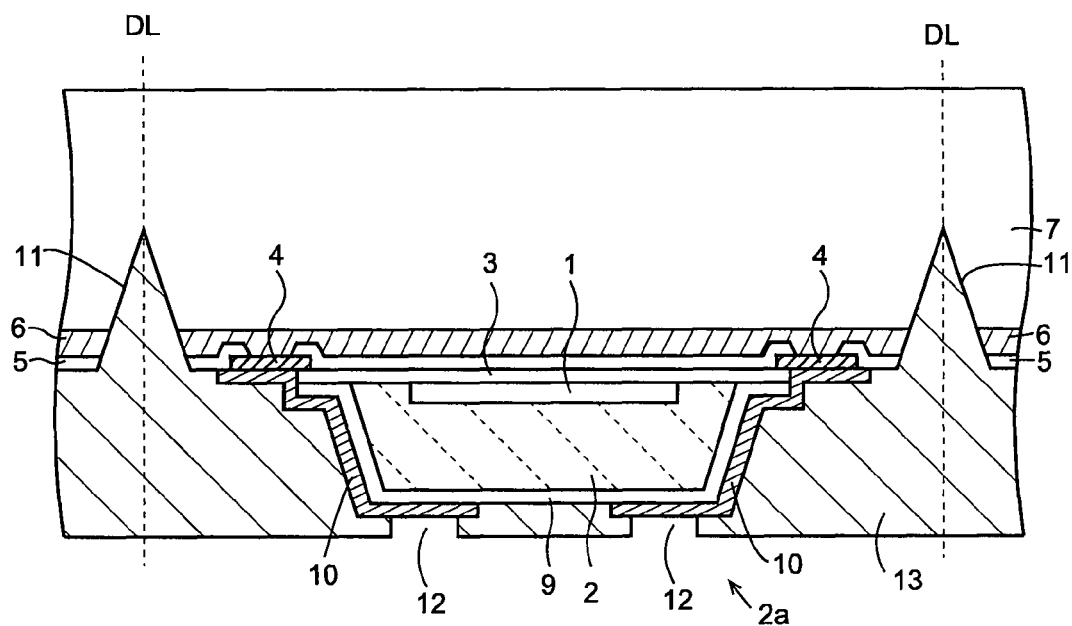
FIG. 7 is a cross-sectional view showing the manufacturing method of the semiconductor device according the first embodiment of this invention.

Next, there is formed the protection layer 13 which has openings 12 at locations corresponding to regions where the conductive terminals 14 (to be described) are formed, so that the side surface and the back surface of the semiconductor die 2a and the groove 11 are covered with the protection layer 13 that is thick enough to fill whole space over the semiconductor die 2a and the groove 11, as shown in FIG. 7.

The protection layer 13 is formed as described below. First, a mold resin is formed to a thickness that is about 30 µm thicker than the semiconductor die 2a using screen printing, for example, so that the semiconductor die 2a is buried in the mold resin that has the openings 12.

Or, an organic material such as a polyimide resin or a solder resist film may be used as a material to form the protection layer 13. Furthermore, an absorptive material that absorbs visible light, infrared ray or the like may be used.

The protection layer 13 may be applied by a dispensing method (a coating method).

In this embodiment, as described above, the protection layer 13 is formed thick enough to completely cover the side surface of the adhesive layer 6 and to fill the space over the semiconductor die 2a and the groove 11. As a result, the semiconductor device 20 according to the embodiment of this invention is improved in the moisture resistance compared with the conventional semiconductor device. Even when a solder resist film having poor moisture resistance is used as the protection layer 13 as in the conventional art, the moisture resistance of the semiconductor device according to the embodiment is maintained because the solder resist film is formed much thicker than in the conventional art.

Figure 8:
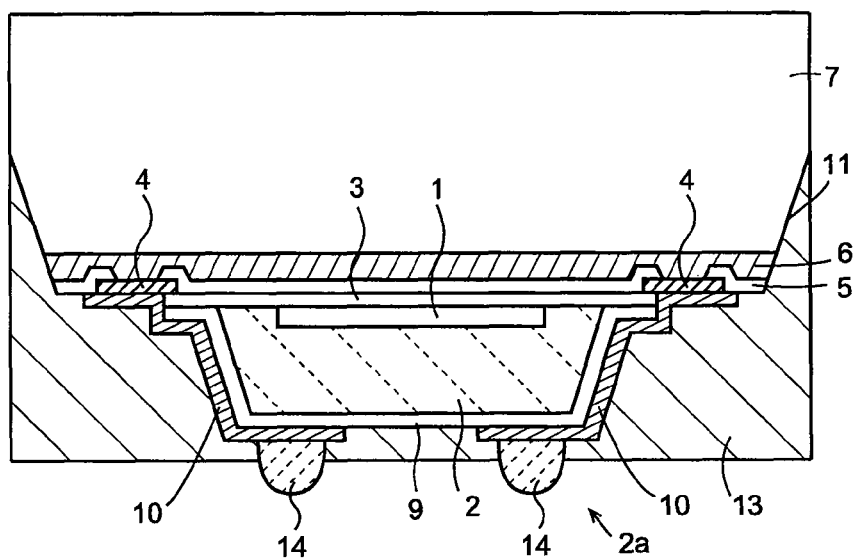
FIG. 8 is a cross-sectional view showing the manufacturing method of the semiconductor device according the first embodiment of this invention.

Next, a conductive material (solder, for example) is screen-printed on the electrode connection layer exposed in the opening 12 in the protection layer 13. Ball-shaped conductive terminals 14 are formed by subsequent thermal treatment to reflow the conductive material, as shown in FIG. 8. The conductive terminals 14 are not limited to be formed by the method described above, and may be formed by other method such as electrolytic plating or so-called dispensing method in which solder or the like is applied to the predetermined regions using a so-called dispensing method. Each of the pad electrodes 4 is electrically connected with corresponding each of the conductive terminals 14 through the wiring layer 10, as described above.

Although explanation referring to the drawing is omitted, the semiconductor device 20 may be reduced in thickness by uniformly reducing the thickness of the supporter 7 from the back surface-side to a predetermined thickness (50 μm, for example).

Reducing the thickness is preferably made by mechanical grinding using a back surface grinder or by spin wet etching in which etching is performed using a chemical solution including hydrofluoric acid while the substrate is rotating. Other etching method such as dip etching may be used as long as the entire back surface of the supporter 7 is etched.

Then the CSP type semiconductor device 20 is completed by dividing the protection layer 13 and the supporter 7 using a dicing blade, as shown in FIG. 8. The semiconductor device 20 is mounted on a printed circuit board through the conductive terminals 14.

In the semiconductor device 20 according to the first embodiment, the protection layer 13 completely covers the entire semiconductor die 2a and the side surface of the adhesive layer 6. As a result, contact between the adhesive layer 6 and ambient air is suppressed and corrosive material (water, for example) is prevented from infiltrating into the semiconductor integrated circuit 1 or the adhesive layer 6.

Next, a semiconductor device and its manufacturing method according to a second embodiment of this invention will be described referring to the drawings. The same structures and manufacturing process steps as in the first embodiment are denoted by the same symbols and explanations on them are omitted.

Figure 9:
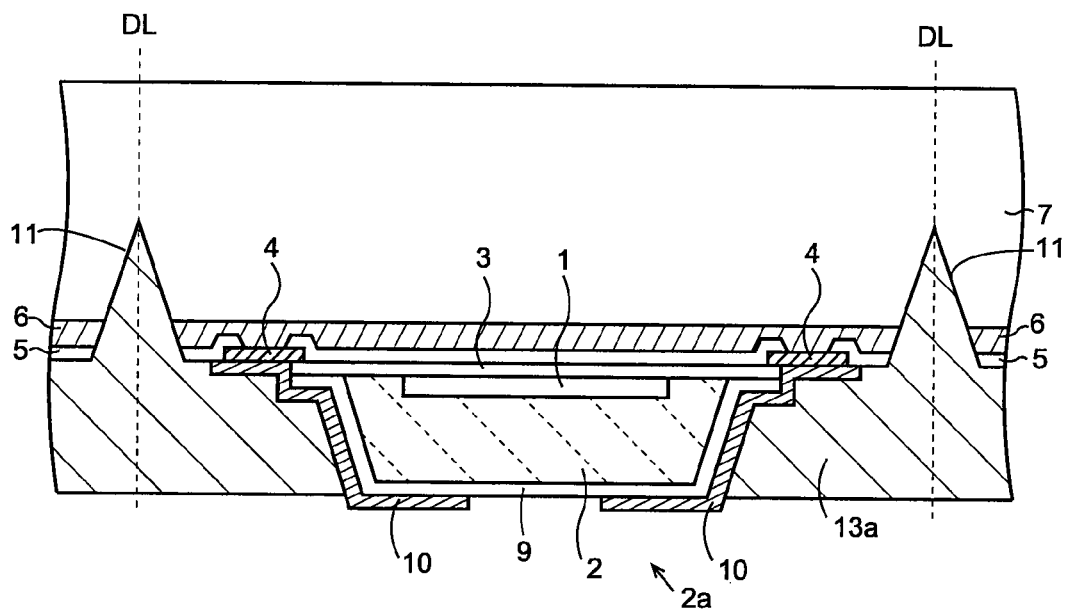
FIG. 9 is a cross-sectional view showing a manufacturing method of a semiconductor device according to a second embodiment of this invention.
Figure 10:
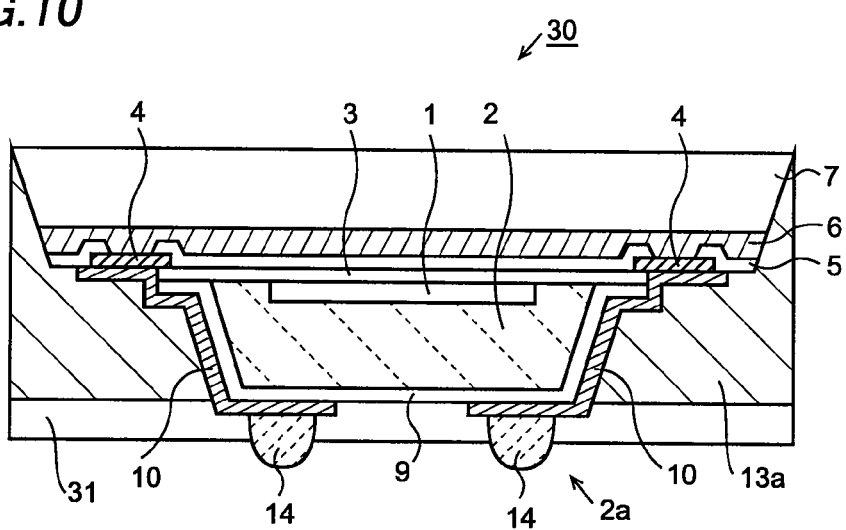
FIG. 10 is a cross-sectional view showing the manufacturing method of the semiconductor device according to the second embodiment of this invention.

In the semiconductor device 20 according to the first embodiment, the protection layer 13 covers all the back surface of the semiconductor substrate 2, as shown in FIG. 8. In the semiconductor device 30 according to the second embodiment, on the other hand, a first protection layer 13a is formed so as not to cover the back surface of the semiconductor substrate 2 as shown in FIG. 9, and a second protection layer 31 having openings is formed over the first protection layer 13a and the back surface of the semiconductor substrate 2, as shown in FIG. 10. The second embodiment features that the conductive terminal 14 is formed to be connected with the electrode connection layer through the opening formed in the second protection layer 31.

In the second embodiment, an underfill material with filler, for example, is applied as the first protection layer 13a by dispensing method. Or, an organic material such as a mold resin, a polyimide resin or a solder resist film may be used as a material to form the first protection layer 13a. Furthermore, an absorptive material that absorbs visible light, infrared ray or the like may be used. Or, a reflective material that reflects visible light, infrared ray or the like may be used. A solder resist material is used as the second protection layer 31.

Figure 11:
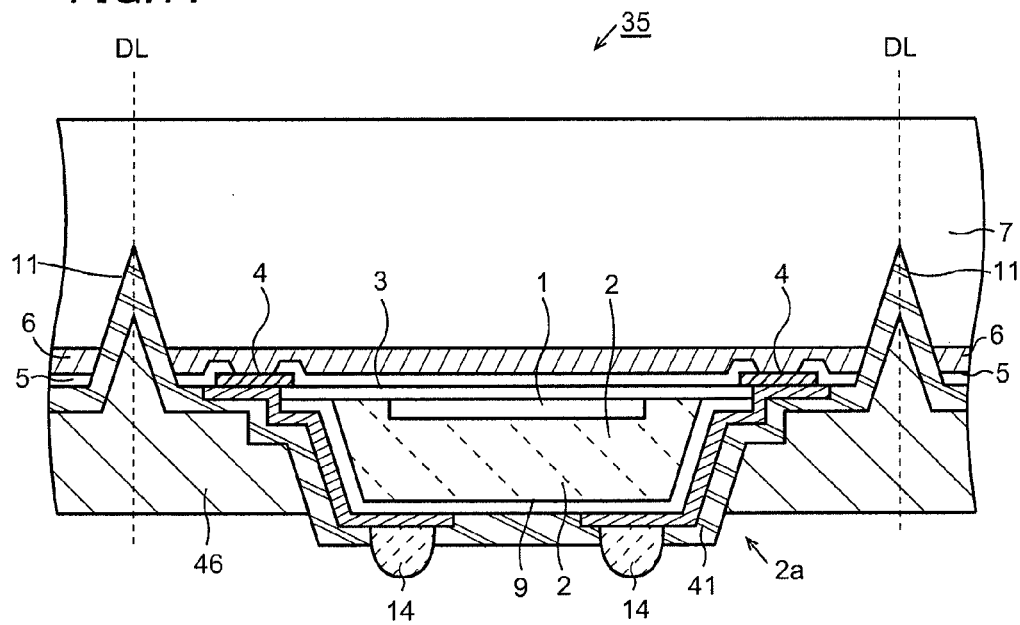
FIG. 11 is a cross-sectional view showing a manufacturing method of a semiconductor device according to a third embodiment of this invention.

Next, a semiconductor device according to a third embodiment of this invention will be explained referring to FIG. 11. The same structures and manufacturing process steps as in the first or second embodiment are denoted by the same symbols and explanations on them are omitted.

The protection layer 13 in the first embodiment and the first protection layer 13a in the second embodiment are formed to fill the space over the groove 11. In the semiconductor device 35 according to the third embodiment, on the other hand, a protection layer 41 having openings is formed to a uniform thickness over the back surface and side surface of the semiconductor substrate 2 and the groove 11. The conductive terminal 14 is formed to be connected with the electrode connection layer through the opening in the protection layer 41. The third embodiment features that a conductive film 46 is formed to cover the groove 11 by applying conductive paste (silver paste, for example) using dispensing method. Or, the conductive film 46 may be formed using screen printing.

The semiconductor device 35 has better moisture resistance than the conventional semiconductor device, since the space over the groove 11 and the side surface of the semiconductor die 2a is filled with the conductive film 46 in the semiconductor device 35 as described above, after the protection layer 41 is formed in the same way as the protection layer 109 is formed in the conventional semiconductor device 100. Because the conductive film 46 is formed, it is made possible to reflect visible light, infrared ray or the like.

Quality of a semiconductor device may be degraded when an adhesive layer is formed on the semiconductor integrated circuit 1. For example, when the semiconductor integrated circuit 1 includes a light-receiving element or a light-emitting element, desired quality is not obtained in some cases because incident light to the semiconductor integrated circuit 1 or emitted light from the semiconductor integrated circuit 1 is blocked by the adhesive layer. Also, there is a problem that the adhesive layer is deteriorated by light of a specific wavelength such as Blu-Ray and the deteriorated adhesive layer degrades operational quality of the semiconductor device.

Figure 12:
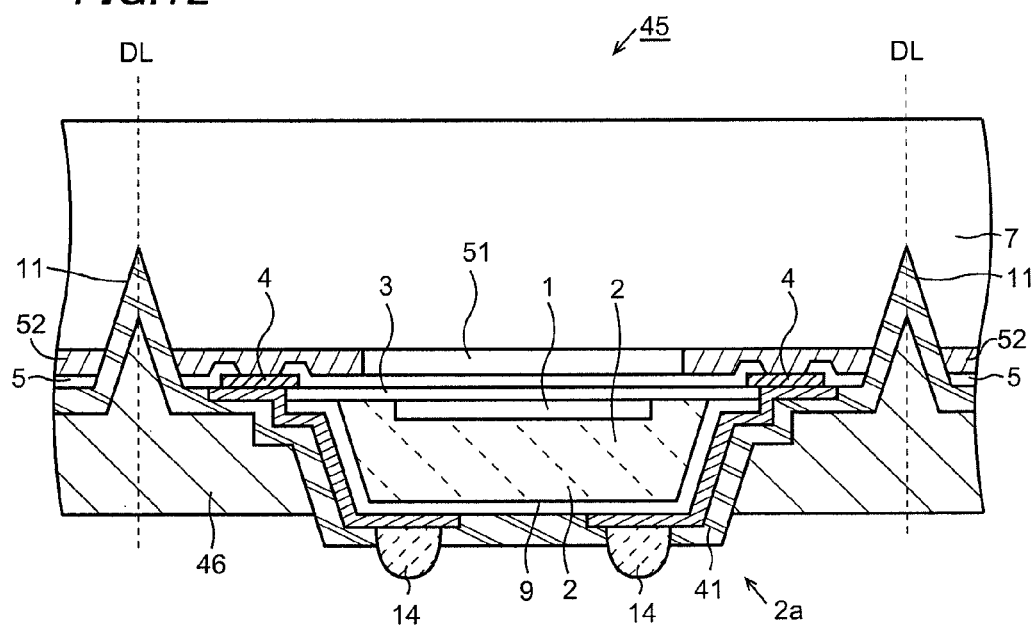
FIG. 12 is a cross-sectional view showing a manufacturing method of a semiconductor device according to a fourth embodiment of this invention.

Therefore, there is no adhesive layer 52 between the semiconductor integrated circuit 1 and the supporter 7 and there is a cavity 51 formed there instead in a semiconductor device 45 according to a fourth embodiment of this invention, as shown in FIG. 12. The structure described above offers an effective solution for a semiconductor device (a semiconductor device for receiving Blu-Ray, for example), the operational quality of which would be degraded by presence of the adhesive layer 52. Although the structure having the cavity 51 is described in the fourth embodiment of this invention, the structure having the cavity 51 may be adopted in the first, second and third embodiments of this invention.

Figure 13:
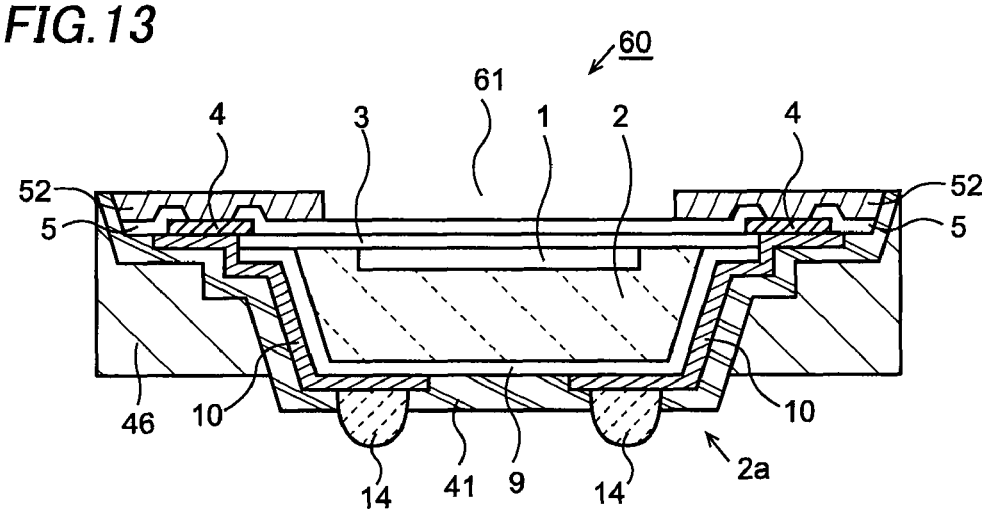
FIG. 13 is a cross-sectional view showing a manufacturing method of a semiconductor device according a fifth embodiment of this invention.

When the supporter 7 is completely removed from the semiconductor device 45 having the cavity 51, there is formed a semiconductor device 60 according to a fifth embodiment of this invention, which is provided with the adhesive layer 52 having an opening 61 above the semiconductor integrated circuit 1, as shown in FIG. 13. It should be noted that the supporter 7 may be removed from the semiconductor devices according to the first, second and third embodiments.

Figure 14:
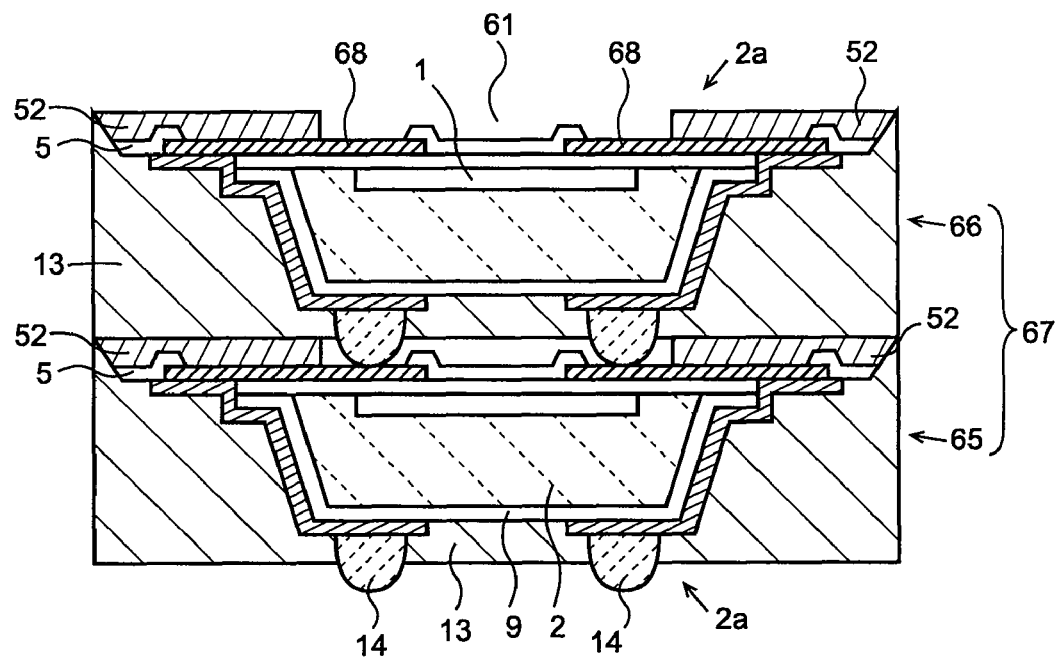
FIG. 14 is a cross-sectional view showing a manufacturing method of a semiconductor device according a sixth embodiment of this invention.

Next, a stacked layer type semiconductor device 67 according to a sixth embodiment of this invention, which is made of vertically stacked semiconductor devices, each provided with the adhesive layer 52 having an opening 61 will be described referring to FIG. 14. FIG. 14 is a cross-sectional view showing the stacked layer type semiconductor device 67 in which a first semiconductor device 65 and a second semiconductor device 66 are stacked. Each of the first and second semiconductor devices 65 and 66 is provided with pad electrodes 68 exposed to outside in the openings 61. The pad electrode 68 is structured in the same way as the pad electrode 4 described above, except that the pad electrode 68 is exposed to outside in the opening 61.

After each of the first and second semiconductor devices 65 and 66 is completed, each of the conductive terminals 14 of the second semiconductor device 66 is aligned with corresponding each of the pad electrodes 68 of the first semiconductor device 65 and the conductive terminals 14 and the pad electrodes 68 are connected with each other by thermo-compression method to complete the stacked layer type semiconductor device 67. Although the first and second semiconductor devices 65 and 66 of the same kind (the same size) are stacked in the embodiment described above, this invention is not limited to stacking the same kind (the same size) of semiconductor devices and may be applied to stacking different kinds (different sizes) of semiconductor devices as long as each of the pad electrodes 68 is aligned with corresponding each of the conductive terminals 14. Also, it is possible as a matter of course to stack another semiconductor device on the second semiconductor device 66.

A height of the stacked layer type semiconductor device 67 can be minimized because the stacked layer type semiconductor device 67 does not have the supporter 7. Because the protection layer 13 is formed to bury the semiconductor substrate 2, in other words, because the space over the side surface and back surface of the semiconductor die 2a and the groove 11 is filled with the protection layer 13, the first and second semiconductor devices 65 and 66 can be brought into close contact with each other so that the stacked layer type semiconductor device 67 is tolerant of shock and the like. The protection layer 13 may be composed of the first protection layer 13a and the second protection layer 31.

Next, a semiconductor device according to a seventh embodiment will be described referring to FIGS. 1 through 6 and FIGS. 15 through 18. Since FIGS. 1 through 6 are explained regarding the first embodiment, detailed descriptions on them are omitted. A depth of the groove 11 shown in FIG. 6 is determined considering the thickness of the supporter 7 after dividing into individual semiconductor devices. For example, when the final thickness of the supporter 7 is to be approximately 50 μm, the groove 11 is formed so that its bottom is approximately 70 μm deep from the surface of the supporter 7. Even when the groove 11 is formed with dicing blade, the dicing blade is used only in this process step and is not used in a process step of dividing into individual semiconductor devices, which will be described below. Since a manufacturing method according to the seventh embodiment of this invention includes less number of process steps that require using the dicing blade compared with the manufacturing method that includes the process step to form the groove 11 using the dicing blade and the process step to obtain the individual semiconductor devices using the dicing blade, total time required by the whole manufacturing process can be reduced with the manufacturing method according to the seventh embodiment.

Figure 15:
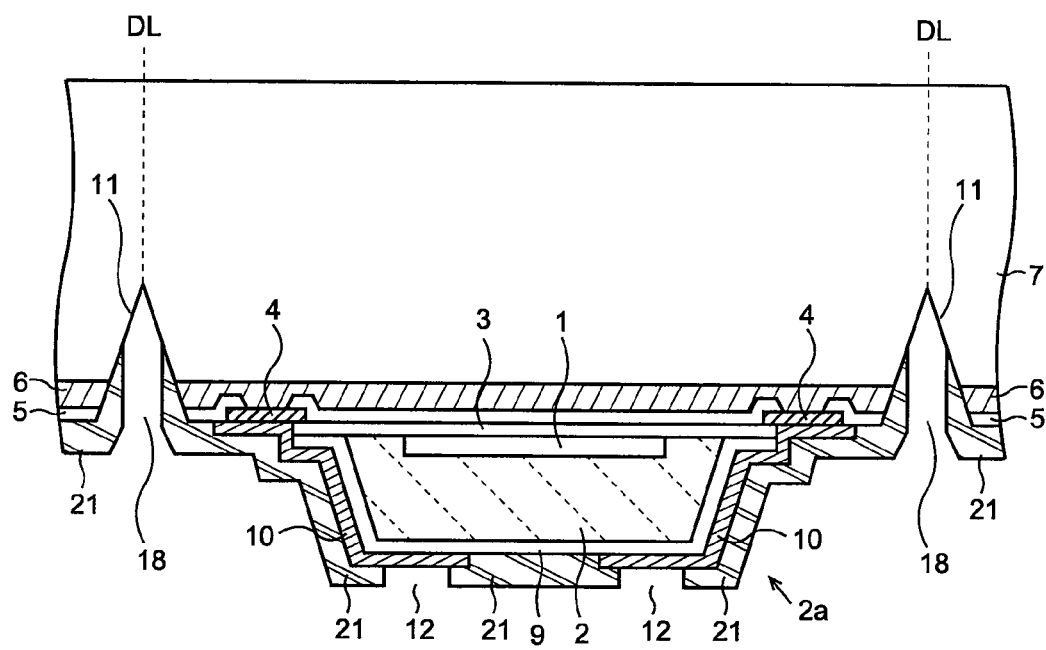
FIG. 15 is a cross-sectional view showing a manufacturing method of a semiconductor device according a seventh embodiment of this invention.

Next, a protection layer 21 having openings 12 and 18 at locations where conductive terminals 15 are to be formed and the grooves 11 are formed is formed to a thickness of 10 μm, for example, as shown in FIG. 15. The protection layer 21 is formed as follows, for example.

First, an organic material such as a polyimide resin or a solder resist is applied over the entire surface by coating method and a thermal treatment (pre-bake) is performed.

Next, the organic material is subject to exposure and development to form the openings that expose predetermined regions followed by a thermal treatment (post-bake). With this, the protection layer 21 having the openings 12 and 18 at the locations where the conductive terminals 15 are to be formed and the grooves 11 are formed is obtained. Although the protection layer 21 according to the seventh embodiment completely covers the side surface of the adhesive layer 6, the protection layer 21 covers the side surface of the supporter 7 only at portions close to the semiconductor substrate 2 and is not formed at least over the dicing lines DL.

In other words, the protection layer 21 extends halfway between the surface of the supporter 7 and the bottom of the groove 11, and is not formed at the bottom of the groove 11. By forming the openings 18 in the protection layer 21 at the locations corresponding to the grooves 11, neighboring semiconductor devices are prevented from remaining connected with each other through the protection layer 21 after back surface etching which is to be described below, so that individual semiconductor devices are separated appropriately.

Figure 16:
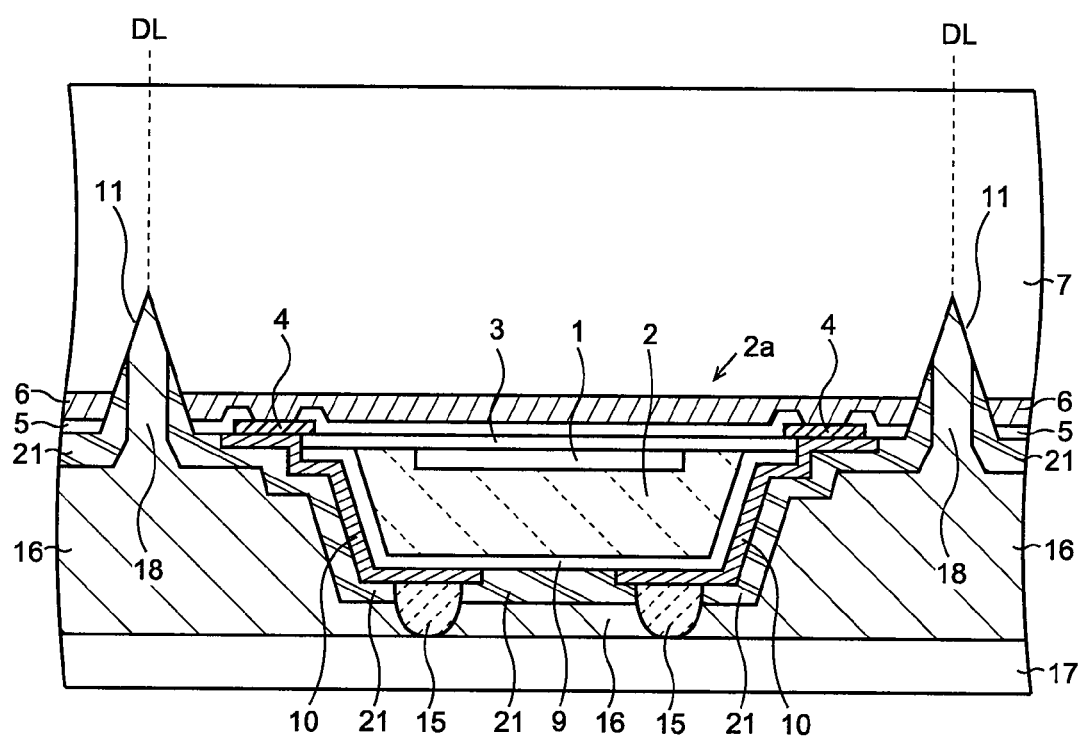
FIG. 16 is a cross-sectional view showing the manufacturing method of the semiconductor device according to the seventh embodiment of this invention.

Next, a conductive material (solder, for example) is screen-printed on the electrode connection layer exposed in the opening 12 in the protection layer 21. Ball-shaped conductive terminals 15 are formed by subsequent thermal treatment to reflow the conductive material, as shown in FIG. 16. The conductive terminals 15 are not limited to be formed by the method described above, and may be formed by other method such as electrolytic plating or so-called dispensing method (coating method) in which solder or the like is applied to predetermined regions using a dispenser. Each of the pad electrodes 4 is electrically connected with corresponding each of the conductive terminals 15 through the wiring layer 10 as described above.

Next, liquid resist material is applied by spin-coating from the back surface-side of the semiconductor substrate 2 to form a resist layer 16 that covers everything including inner walls of the grooves 11, the conductive terminals 15 and the protection layer 21. The resist layer 16 is thick enough to fill the space over the semiconductor die 2a and the grooves 11. Then the resist layer 16 is hardened by heat treatment. Note that the resist layer 16 is in contact with the supporter 7 at the bottom of the groove 11 since the groove 11 is filled with the resist layer 16 through the opening 18.

Next, a protection material 17 such as a film-shaped UV (ultraviolet) tape or a glass substrate is bonded to the back surface of the semiconductor die 2a. The protection material 17 serves to protect the conductive terminals 15 as well as bolstering the semiconductor die 2a in a process step to reduce the thickness of the supporter 7, which is to be described below, and in subsequent transportation.

Figure 17:
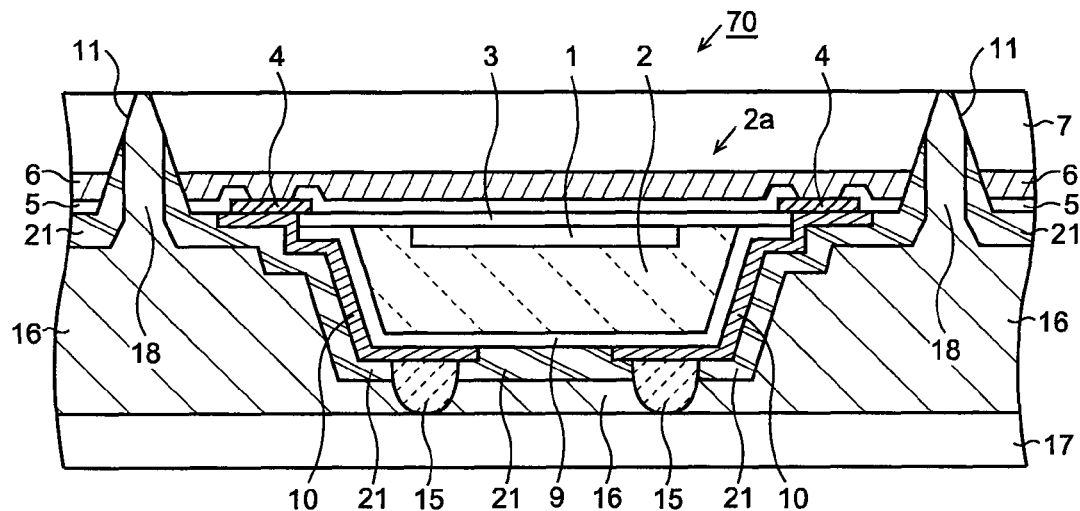
FIG. 17 is a cross-sectional view showing the manufacturing method of the semiconductor device according to the seventh embodiment of this invention.

Next, the supporter 7 is thinned to a predetermined thickness (50 μm, for example) by uniformly reducing the thickness from its back surface-side until the groove 11 and the resist layer 16 are exposed, as shown in FIG. 17. Reducing the thickness is preferably made by mechanical grinding using a back surface grinder or by spin wet etching in which etching is performed using a chemical solution including hydrofluoric acid while the substrate is rotating. Other etching method such as dip etching may be used as long as the entire back surface of the supporter 7 is etched.

The etching of the supporter 7 is controlled by a predetermined etching time calculated based on a etch rate, or terminated when exposure of the resist layer 16 is detected by an optical device or by other means. As described above, the supporter 7 in wafer form is divided into islands, that is, chip-shaped individual semiconductor devices 70 are formed all at once.

Although the grooves 11 are exposed on the back surface of the supporter 7, it should be noted that the resist layer 16 remains in the grooves 11 and the protection material 17 is bonded to the back surface of the semiconductor die 2a. Therefore the individual semiconductor devices 70 are held together. Since the resist layer 16 and the protection material 17 serve as barriers, corrosive material such as chemical solution does not infiltrate into the semiconductor die 2a to degrade the operational characteristics of the semiconductor device 70.

After the supporter 7 is thinned from its back surface-side, the semiconductor devices 70 are transported while they are bonded to the protection material 17, with a gap between neighboring semiconductor devices 70 being tightly filled with the resist layer 16. Therefore, it is not likely that the neighboring semiconductor devices 70 would be brought into contact with each other during transportation and be damaged mechanically.

Next, a predetermined solvent is provided from the back surface-side of the supporter 7 to dissolve the resist layer 16. After that, the individual semiconductor devices 70 separated from the protection material 17 are picked up. In the case where the protection material 17 is made of the UV tape, the protection material 17 is subject to ultraviolet radiation to reduce the adherence so that the semiconductor devices 70 are easily picked up.

It is also possible that another tape is bonded to the back surface of the supporter 7, the protection material 17 is removed, and then solvent is provided from the back surface-side of the semiconductor die 2a to dissolve the resist layer 16.

Figure 18:
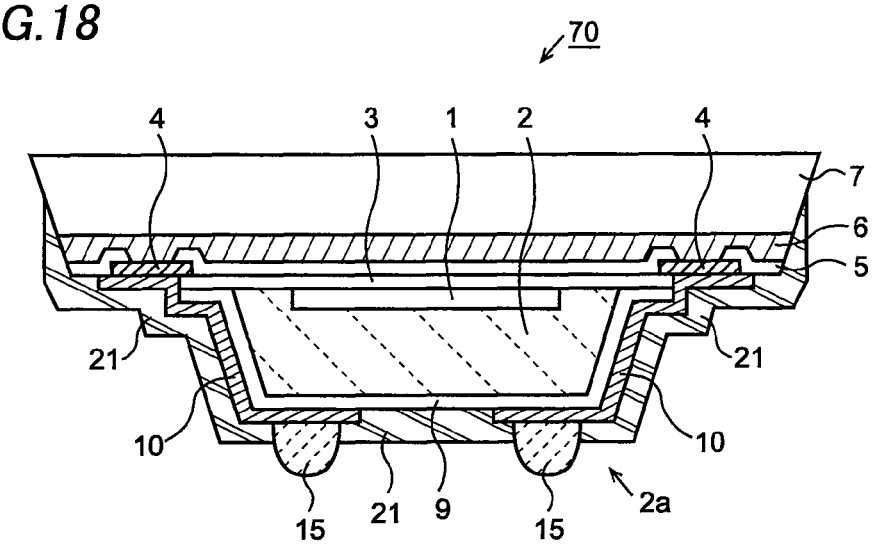
FIG. 18 is a cross-sectional view showing the manufacturing method of the semiconductor device according to the seventh embodiment of this invention.

With the process steps described above, the chip size package type semiconductor device 70 is completed as shown in FIG. 18. The semiconductor device 70 is mounted on a printed circuit board through the conductive terminals 15.

In the seventh embodiment of this invention, the individual semiconductor devices are not separated by dicing along each of the dicing lines DL at a time as in the conventional art, but by etching the whole back surface of the supporter 7, as described above. Since the semiconductor devices are separated all at once, time required in the dicing process step is significantly reduced to improve productivity.

Since the supporter 7 is thinned and the semiconductor devices are separated all at once, thin semiconductor devices can be manufactured more effectively in the seventh embodiment than in the conventional art. Since the supporter 7 is thinned after all the components in the semiconductor device such as the wiring layer 10, the conductive terminals 15 and the protection layer 14 are completed, the forming of each of the components is not affected by the reduction in rigidity of the supporter 7 due to the reduction in the thickness.

Although the grooves 11 are exposed on the back surface of the supporter 7 as a result of back surface etching, the resist layer 16 remains in the grooves 11 and the protection material 17 is bonded to the back surface of the semiconductor die 2a. Thus, corrosive material (fine particles caused in the back surface etching of the supporter 7 or the chemical solution used in the etching, for example) does not infiltrate into the semiconductor die 2a to degrade the quality of the semiconductor device 70.

The protection layer 21 covers all side surfaces of the adhesive layer 6 and portions of the side surfaces of the supporter 7 close to the semiconductor substrate 2 in the seventh embodiment. As a result, contact between the adhesive layer 6 and ambient air is suppressed and corrosive material (water, for example) is prevented from infiltrating into the semiconductor integrated circuit 1 or the adhesive layer 6.

Next, an eighth embodiment of this invention will be explained referring to the drawings. The same structures and manufacturing process steps as in the seventh embodiment are denoted by the same symbols and explanations on them are omitted.

Figure 19:
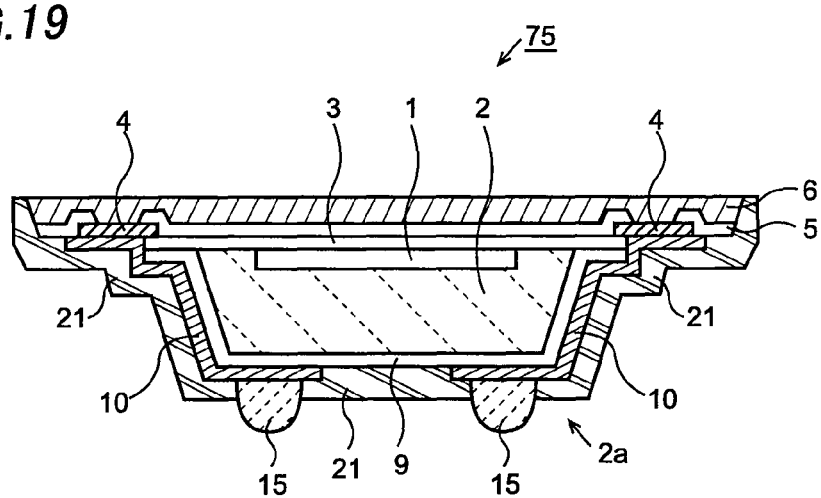
FIG. 19 is a cross-sectional view showing a manufacturing method of a semiconductor device according an eighth embodiment of this invention.

In the seventh embodiment, the back surface of the supporter 7 is etched off partway through the thickness of the supporter 7, as shown in FIG. 17. In the eighth embodiment, on the other hand, the supporter 7 is completely etched off. The etching of the supporter 7 is terminated when the supporter 7 is completely etched off by controlling an etch rate, for example. A semiconductor device 75 with an uppermost surface made of the adhesive layer 6 as shown in FIG. 19 is obtained through the process described above. In this case, the adhesive layer 6 serves to protect the surface of the semiconductor die 2a.

Since the semiconductor devices 75 are separated all at once in the eighth embodiment as in the seventh embodiment, time required in the dicing process step is significantly reduced to improve productivity. Since the supporter 7 is eliminated, the semiconductor device 75 according to the eighth embodiment is even thinner than the semiconductor device 70 according to the seventh embodiment.

Next, a ninth embodiment of this invention will be explained referring to the drawings. The same structures and manufacturing process steps as in the seventh or eighth embodiment are denoted by the same symbols and explanations on them are omitted.

Figure 20:
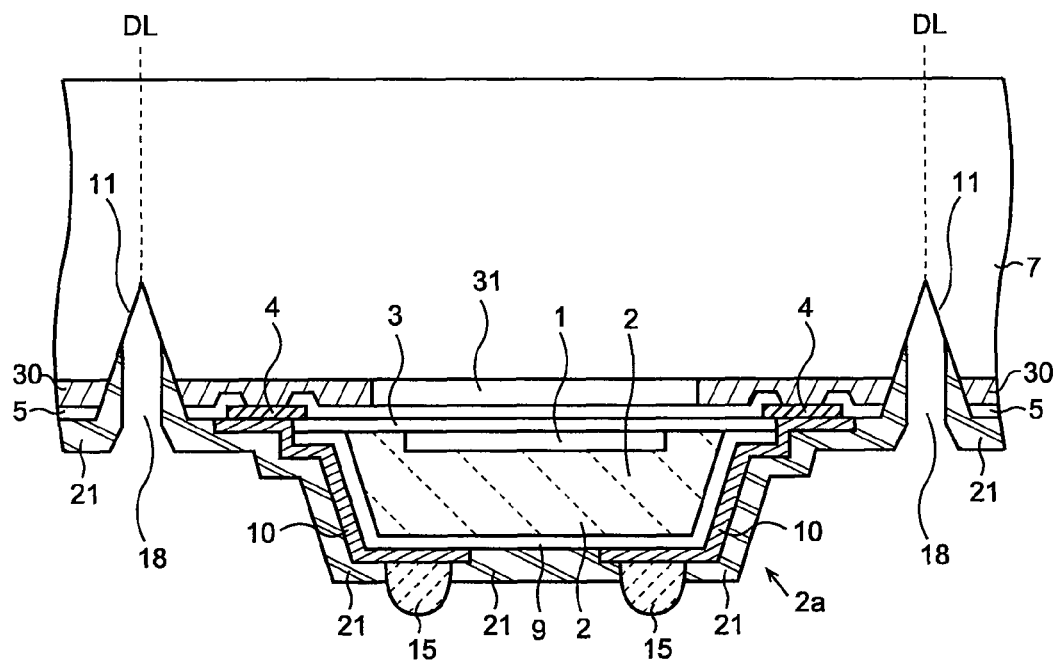
FIG. 20 is a cross-sectional view showing a manufacturing method of a semiconductor device according a ninth embodiment of this invention.

The adhesive layer 6 is uniformly formed between the semiconductor substrate 2 and the supporter 7 in the seventh and eighth embodiments. In the ninth embodiment, on the other hand, an adhesive layer 30 is partially formed between the semiconductor substrate 2 and the supporter 7 and a cavity 31 similar to the cavity 51 in the fourth embodiment is formed between the semiconductor die 2a and the supporter 7, as shown in FIG. 20.

The cavity 31 is an inner space surrounded by the semiconductor die 2a, the adhesive layer 30 and the supporter 7. It is formed by applying a ring-shaped material of the adhesive layer 30 on the surface of the semiconductor substrate 2 followed by bonding it to the supporter 7, for example.

A semiconductor device having the cavity 31 is formed by etching the back surface of the supporter 7 until the grooves 11 are exposed as described regarding FIG. 16 and FIG. 17.

As stated in the fourth embodiment, quality of the semiconductor device may be degraded when the adhesive layer is formed on the semiconductor integrated circuit 1. For example, when the semiconductor integrated circuit 1 includes a light-receiving element or a light-emitting element, desired quality is not obtained in some cases because incident light to the semiconductor integrated circuit 1 or emitted light from the semiconductor integrated circuit 1 is blocked by the adhesive layer.

Also, there is a problem that the adhesive layer is deteriorated by light of a specific wavelength such as Blu-Ray and the deteriorated adhesive layer degrades operational quality of the semiconductor device.

Because the cavity 31 is formed, there is no adhesive layer between the semiconductor integrated circuit 1 and the supporter 7 in the semiconductor device according to the ninth embodiment as in the semiconductor device 45 according to the fourth embodiment. Therefore, the structure described above offers an effective solution for a semiconductor device (a semiconductor device for receiving Blu-Ray, for example), the operational quality of which would be degraded by presence of the adhesive layer.

Figure 21:
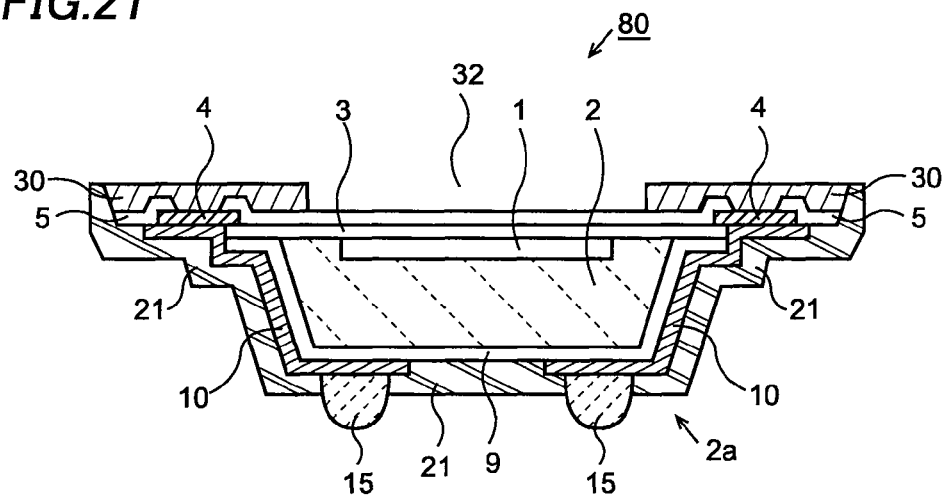
FIG. 21 is a cross-sectional view showing the manufacturing method of the semiconductor device according to the ninth embodiment of this invention.

When the supporter 7 is completely removed from a structure with the cavity 31 shown in FIG. 20 as described in the eighth embodiment, there is formed a semiconductor device 80 provided with the adhesive layer 30 having an opening 32 above the semiconductor integrate circuit 1, as shown in FIG. 21. The semiconductor device 80 is structured similar to the semiconductor device 60 according to the fifth embodiment shown in FIG. 13 which is provided with the adhesive layer 52 having the opening 61.

Figure 22:
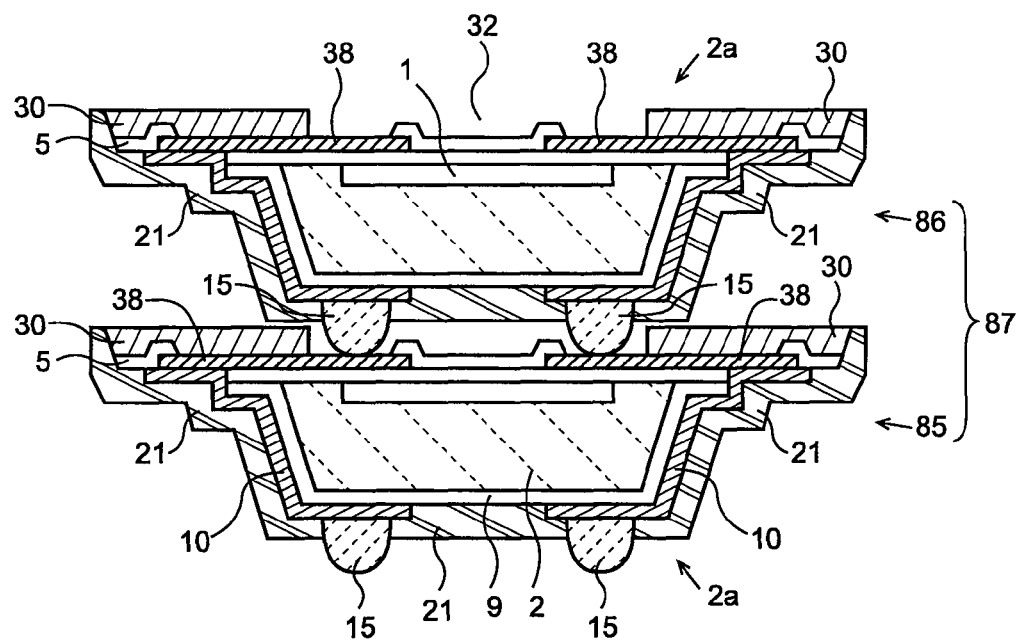
FIG. 22 is a cross-sectional view showing a stacked layer structure of the semiconductor device according the ninth embodiment of this invention.

Therefore, as described in the sixth embodiment, it is possible to form a stacked layer type semiconductor device 87 that is made of vertically stacked semiconductor devices, each provided with the adhesive layer 30 having the opening 32, as shown in FIG. 22. Outline of the stacked layer type semiconductor device is explained referring to FIG. 22, although there may be some duplication in the explanation. FIG. 22 is a cross-sectional view showing the stacked layer type semiconductor device 87 in which a first semiconductor device 85 and a second semiconductor device 86 are stacked. Each of the first and second semiconductor devices 85 and 86 is provided with pad electrodes 38 exposed to outside in the opening 32. The pad electrode 38 is structured in the same way as the pad electrode 4 described above, except that the pad electrode 38 is exposed to outside in the opening 32.

After the first and second semiconductor devices 85 and 86 are completed, each of the conductive terminals 15 of the second semiconductor device 86 is aligned with corresponding each of the pad electrodes 38 of the first semiconductor device 85 and the conductive terminals 15 and the pad electrodes 38 are connected with each other by thermo-compression method to complete the stacked layer type semiconductor device 87. Also, it is possible as a matter of course to stack another semiconductor device on the second semiconductor device 86. A height of the stacked layer type semiconductor device 87 can be minimized because the stacked layer type semiconductor device 87 does not have the supporter 7.

Next, a tenth embodiment of this invention will be explained referring to the drawings. The same structures and manufacturing process steps as in the seventh through ninth embodiments are denoted by the same symbols and explanations on them are omitted.

Figure 23:
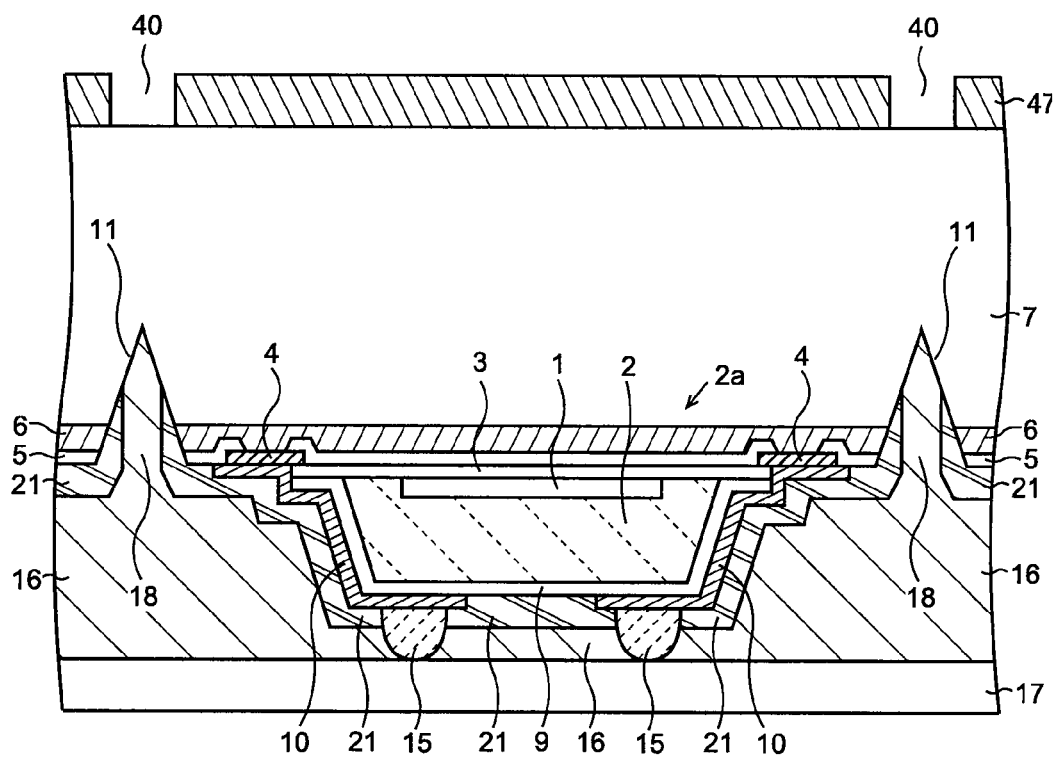
FIG. 23 is a cross-sectional view showing a manufacturing method of a semiconductor device according a tenth embodiment of this invention.

The supporter 7 is thinned by uniformly reducing the thickness from its back surface-side in the seventh through ninth embodiments. In the tenth embodiment, on the other hand, the supporter 7 is partially etched from its back surface. First, the grooves 11 and the resist layer 16 are formed, the protection material 17 is bonded to the back surface of the semiconductor die 2a, and a resist layer 47 having openings 40 at locations corresponding to the grooves 11 is formed on the back surface of the supporter 7, as shown in FIG. 23.

Figure 24:
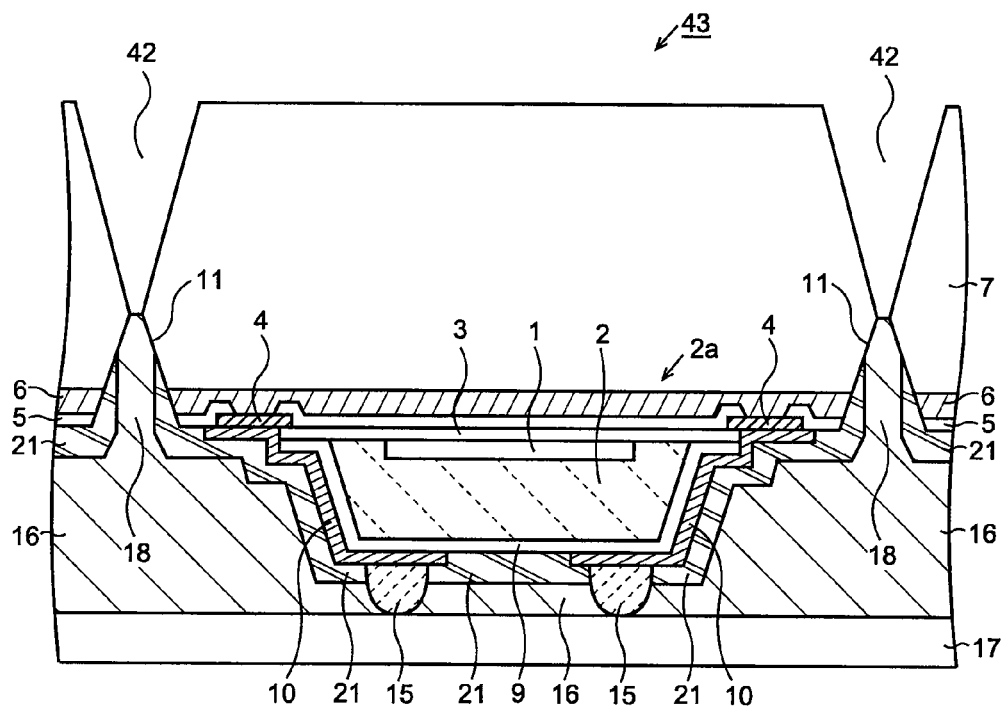
FIG. 24 is a cross-sectional view showing the manufacturing method of the semiconductor device according to the tenth embodiment of this invention.

Next, the back surface of the supporter 7 is partially etched using the resist layer 47 as a mask to form openings 42 in the supporter 7, as shown in FIG. 24. The openings 42 are formed in large numbers at locations corresponding to the grooves 11, that is, in rows and columns along the borders between the individual semiconductor devices. The etching is carried out until the opening 42 reaches the groove 11 to expose the groove 11 and the resist layer 16. As a result, the supporter 7 in wafer form is separated into islands and chip-shaped individual semiconductor devices 43 are formed all at once.

Wet etching is preferable as a method used in the etching from a standpoint that a large number of substrates are processed all together to reduce time required in the manufacturing process. In this case, the supporter 7 covered with the resist layer 47 is placed in a container and submerged in predetermined chemical solution that fills the container. The etching of the back surface of the supporter 7 may be carried out by dry etching or sand blasting.

Although side surfaces of the supporter 7 stretching from the back surface to the groove 11 are shown to be tapered by the etching in FIG. 24, it is also possible to make the side surfaces approximately perpendicular to a principal surface of the supporter 7 when the supporter 7 is etched by anisotropic etching such as dry etching or by sand blasting.

Next, predetermined solvent is provided from the openings 42 to dissolve the resist layer 16. After that, the individual semiconductor devices 43 separated from the protection material 17 are picked up.

In the tenth embodiment, as described above, the individual semiconductor devices 43 are not separated by dicing along each of the dicing lines DL at a time as in the conventional art, but by partially etching the back surface of the supporter 7 using the resist layer 47 having the openings 42 along the borders between the individual semiconductor devices. Since the semiconductor devices are separated all at once, time required in the dicing process step is significantly reduced to improve productivity.

Next, an eleventh embodiment of this invention will be explained referring to the drawings. The same structures and manufacturing process steps as in the seventh through tenth embodiments are denoted by the same symbols and explanations on them are omitted.

Figure 25:
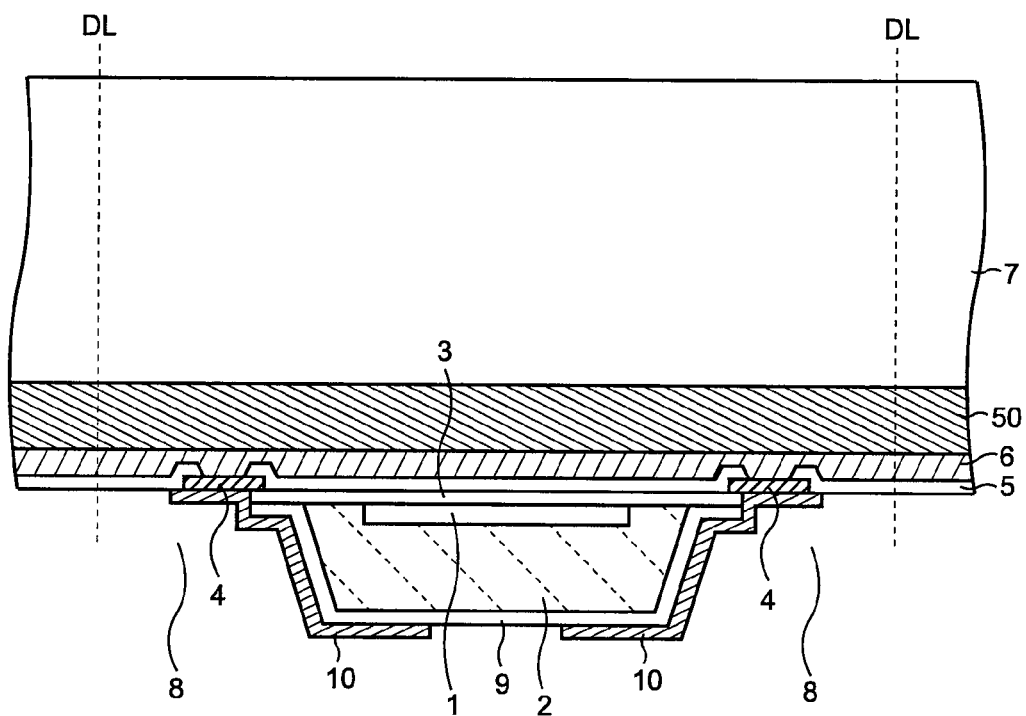
FIG. 25 is a cross-sectional view showing a manufacturing method of a semiconductor device according an eleventh embodiment of this invention.

A tape 50 is bonded to the surface of the semiconductor substrate 2 through the adhesive layer 6 and the supporter 7 is bonded to the tape 50, as shown in FIG. 25. The tape 50 is preferably made of a material such as polyimide, which is different from the adhesive layer 6 or a protection layer 55 that is to be described below. That is to prevent the adhesive layer 6 and the protection layer 55 from being removed when a solvent to reduce viscosity of the tape 50 is provided later in order to remove the tape 50. Next, the openings 8, the insulation film 9 and the wiring layer 10 and the like are formed in the same process as in the seventh embodiment.

Figure 26:
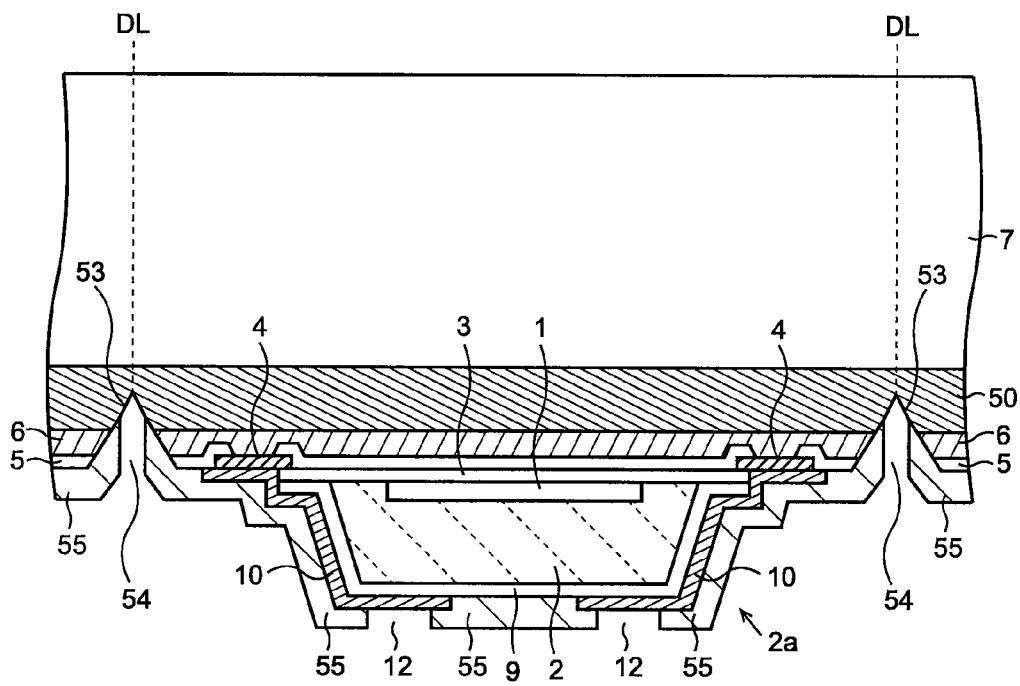
FIG. 26 is a cross-sectional view showing the manufacturing method of the semiconductor device according to the eleventh embodiment of this invention.

Next, a groove 53 reaching partway through a thickness of the tape 50 is formed by removing a portion of the passivation film 5, the adhesive layer 6 and the tape 50 with a dicing blade or by dry etching, as shown in FIG. 26. A large number of grooves 53 are formed in rows and columns in the surface of the tape 50 along borders (dicing lines DL) between the individual semiconductor devices.

Next, there is formed the protection layer 55 made of solder resist or the like and having openings 12 and 54 at locations corresponding to regions where the conductive terminals 15 are to be formed and locations corresponding to the grooves 53. Although the protection layer 55 according to the eleventh embodiment completely covers the side surface of the adhesive layer 6, the protection layer 55 covers the side surface of the tape 50 only at portions close to the semiconductor die 2a and is not formed at least over the dicing lines DL.

In other words, the protection layer 55 extends halfway between the side surface of the adhesive layer 6 and a bottom of the groove 53, and is not formed at the bottom of the groove 53. By forming the openings 54 at the locations corresponding to the grooves 53 as described above, neighboring semiconductor devices are prevented from remaining connected with each other through the protection layer 55 after the tape 50 is removed, so that the individual semiconductor devices are separated appropriately.

Figure 27:
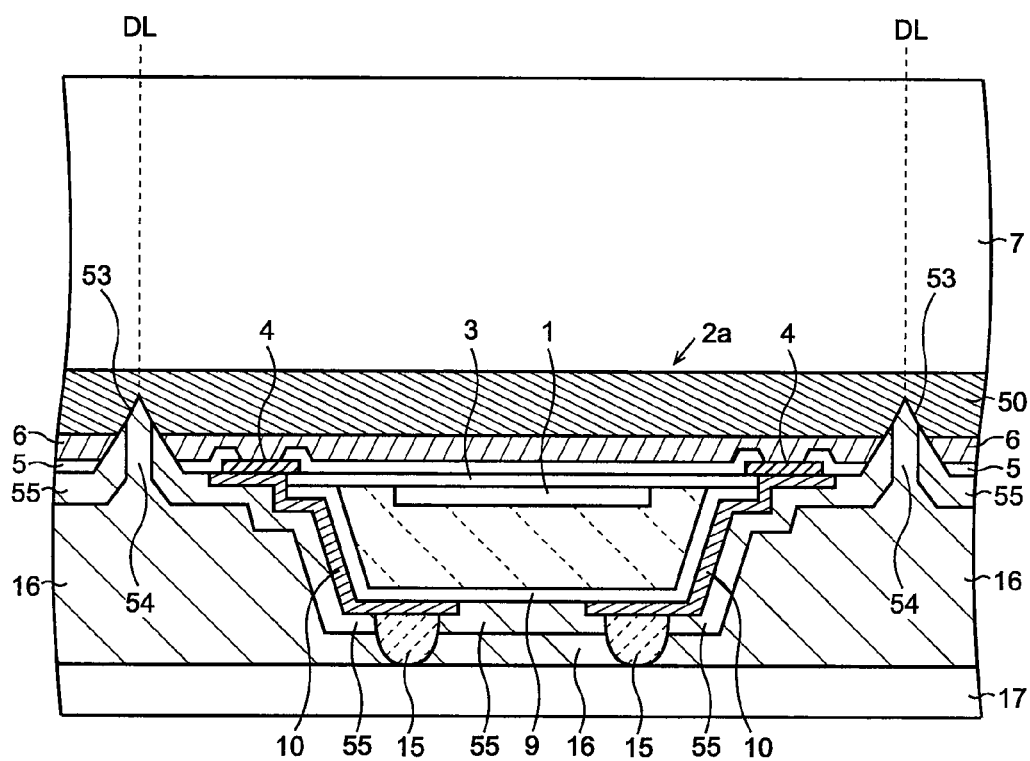
FIG. 27 is a cross-sectional view showing the manufacturing method of the semiconductor device according to the eleventh embodiment of this invention.

Next, the conductive terminal 15 is formed on the electrode connection layer exposed in each of the openings 12 in the protection layer 55, as shown in FIG. 27. Then, a resist material is applied from the back surface-side of the semiconductor die 2a to form a resist layer 16 that covers everything including inner walls of the grooves 53, the conductive terminals 15 and the protection layer 55. The resist layer 16 is in contact with the tape 50 at the bottom of the groove 53. Then, the protection material 17 is bonded to the back surface of the semiconductor die 2a.

Next, the supporter 7 is partially etched using the resist layer 47 to expose the tape 50, as described referring to FIG. 24. Then, predetermined solvent is provided to the exposed tape 50 so that the tape 50 is removed to separate the semiconductor die 2a from the supporter 7.

Figure 28:
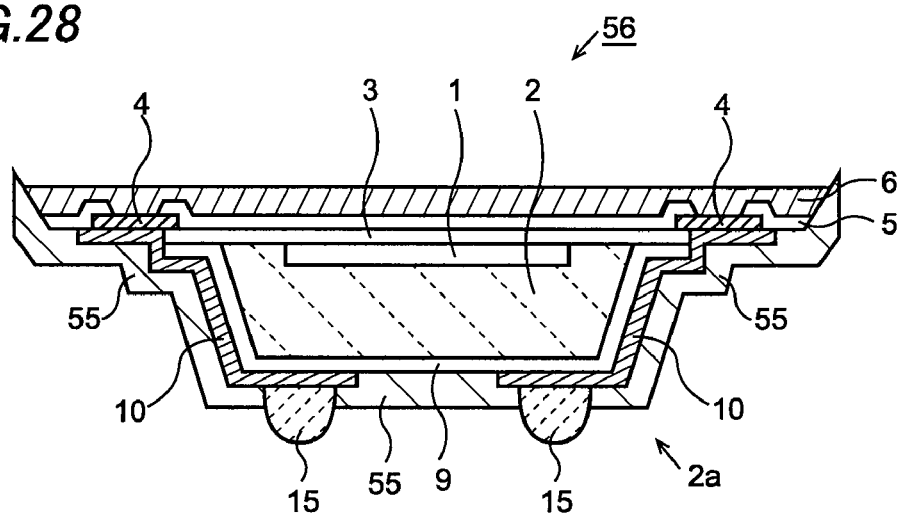
FIG. 28 is a cross-sectional view showing the manufacturing method of the semiconductor device according the eleventh embodiment of this invention.
Figure 29:
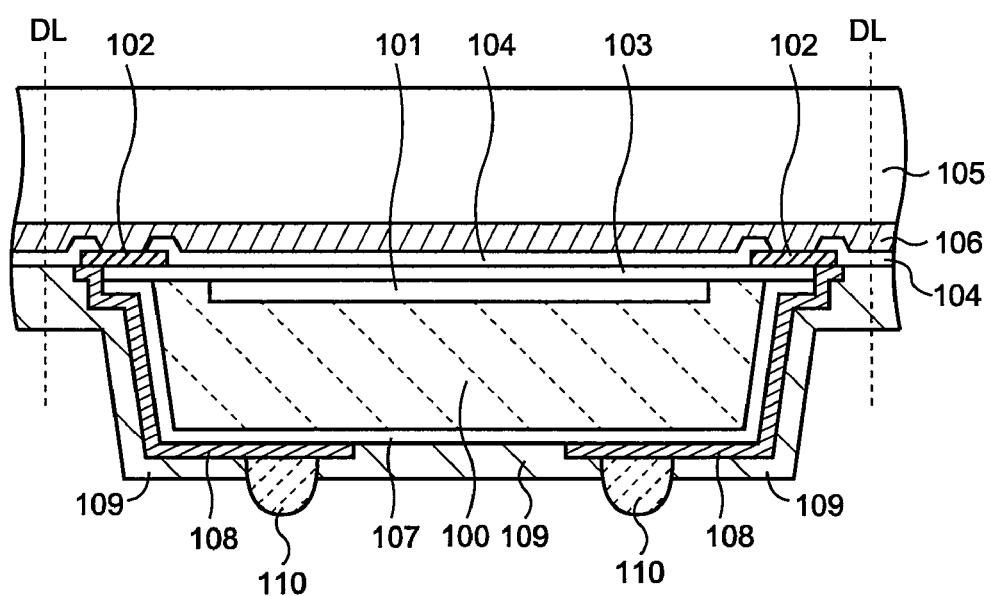
FIG. 29 is a cross-sectional view showing a conventional semiconductor device.

Next, the resist layer 16 is removed and individual semiconductor devices 56 separated from the protection material 17 are picked up. With the process steps described above, the chip size package type semiconductor device 56 is completed as shown in FIG. 28.

Since the semiconductor devices are separated all at once in the eleventh embodiment as in the seventh through tenth embodiments, time required in the dicing process step is significantly reduced to improve the productivity. Also, since the supporter 7 is removed, a semiconductor device with reduced thickness is made available.

Next, a twelfth embodiment of this invention is described. Explanations on the same structure and manufacturing process steps as in the first through fifth embodiments are omitted or simplified.

In the seventh embodiment, the resist layer 16 covers everything including the inner walls of the grooves 11, the conductive terminals 15 and the protection layer 21, as shown in FIG. 16. In the twelfth embodiment, on the other hand, the protection material 17 is bonded to the back surface of the semiconductor die 2a without forming the resist layer 16. Since a semiconductor device according to the twelfth embodiment is the same as the semiconductor device shown in FIG. 16 except that the resist layer 16 is not formed, a drawing showing the semiconductor device according to the twelfth embodiment is omitted.

Then, the back surface of the supporter 7 is uniformly etched, or a resist layer having openings at locations corresponding to the grooves 11 is formed on the back surface of the supporter 7 (Refer to FIG. 23.) and the supporter 7 is partially etched using the resist layer as a mask.

The etching is carried out until the grooves 11 are exposed so that the supporter 7 in wafer form is separated into islands and chip-shaped individual semiconductor devices are formed all at once in the seventh and tenth embodiments. In the twelfth embodiment, on the other hand, the etching is stopped before the grooves 11 are exposed. That is, the thickness of the supporter 7 is extremely reduced at the locations corresponding to the grooves 11. The thickness of the supporter 7 at the locations is 50-100 μm, for example.

Because the etching is not carried out until the grooves 11 are exposed, even though the resist layer 16 is not formed, the supporter 7 serves as a barrier to prevent corrosive material (fine particles caused in the back surface etching of the supporter 7 or chemical solution used in the etching, for example) from infiltrating into the semiconductor substrate 2 to degrade the quality of the semiconductor device.

Next, physical or mechanical load, or pressure, is applied to the locations where the supporter 7 is thinned so that the supporter 7 is separated along the grooves 11. To be more specific, the supporter 7 is separated by applying predetermined pressure from the back surface-side of the supporter 7 toward the surface-side along the grooves 11 using a human hand or a predetermined tool.

The supporter 7 in wafer form is divided into islands, that is, chip-shaped individual semiconductor devices are formed, as described above.

It is possible, as described above, to form the individual semiconductor devices through the two process steps (the process step to etch the back surface of the supporter 7 and the process step to apply the pressure to the locations corresponding to the grooves 11. The manufacturing method described above has a merit that the corrosive material is prevented from infiltrating into the semiconductor die 2a without forming the resist layer 16. Also, since using a dicing blade is not necessary, time required by the dicing process can be saved. In addition, the productivity can be enhanced, because the individual semiconductor devices can be obtained all at once by applying the pressure successively or simultaneously to all the locations corresponding to the grooves 11 on the back surface of the supporter 7.

It is apparent that this invention is not limited to the embodiments described above and may be modified within the scope of the invention. For example, although the BGA type semiconductor devices having ball-shaped conductive terminals are described in the embodiments, this invention may be applied to an LGA (Land Grid Array) type semiconductor device and other CSP (Chip Size Package) type semiconductor devices.

Also, although the conductive terminals are formed on the back surface of the semiconductor substrate in the embodiments described above, the conductive terminals may be disposed on a side surface of the semiconductor substrate.

Although the protection layer 14 or 54 is formed in the seventh or twelfth embodiment, respectively, this invention may be applied to a semiconductor device in which no protection layer is formed, and may be widely applied as a manufacturing method to effectively obtain chip-shaped individual semiconductor devices. In this case, a metallic material (copper, for example) that is highly resistant to corrosive materials such as water is preferably used as the wiring layer 10.

This invention can offer the semiconductor devices with improved moisture resistance compared with the conventional structure, because the protection layer is formed to fill the space over the semiconductor die in the semiconductor devices according to the embodiments of this invention. Also, according to the embodiments of this invention, time required in dicing process can be significantly reduced to improve the productivity, because the individual semiconductor devices can be obtained all at once without dicing along each of the dicing lines at a time. In addition, the semiconductor devices can be reduced in thickness, because the manufacturing method according to the embodiments of this invention includes thinning the supporter or removing the supporter.

What is claimed is:

1. A semiconductor device comprising:
   a semiconductor substrate comprising a circuit element formed in a top surface thereof;
   a first insulation film disposed on the top surface of the semiconductor substrate;
   a metal pad connected to the circuit element and disposed at least partially on the first insulation film adjacent a lateral edge of the top surface;
   a second insulation film disposed on a side surface and a bottom surface of the semiconductor substrate;
   a metal wiring disposed on the second insulation film so as to be connected to a bottom portion of the metal pad, the metal wiring extending from the bottom surface to the side surface of the semiconductor substrate;

a protection layer covering the metal wiring so that a thickness of an edge portion of the protection layer is larger than a sum of thicknesses of the semiconductor substrate, the first and second insulation films and the metal wiring; and a conductive terminal connected to the metal wiring through an opening formed in the protection layer.

2. A semiconductor device comprising:

a semiconductor substrate comprising a circuit element formed in a top surface thereof;

a first insulation film disposed on the top surface of the semiconductor substrate;

a metal pad connected to the circuit element and disposed at least partially on the first insulation film adjacent a lateral edge of the top surface;

a second insulation film disposed on a side surface and a bottom surface of the semiconductor substrate;

a metal wiring disposed on the second insulation film so as to be connected to a bottom portion of the metal pad, the metal wiring extending from the bottom surface to the side surface of the semiconductor substrate;

a protection layer comprising a first protection layer and a second protection layer and covering the metal wiring so as to make a surface of the protection layer flat at the metal pad; and a conductive terminal connected to the metal wiring through an opening formed in the protection layer.

3. The semiconductor device of claim 1, further comprising a supporter bonded to the top surface of the semiconductor substrate so as to cover the top surface of the semiconductor substrate and the metal pad.

4. A semiconductor device comprising:

a first semiconductor device comprising a semiconductor substrate comprising a circuit element formed in a top surface thereof, a first insulation film disposed on the top surface of the semiconductor substrate, a metal pad connected to the circuit element and disposed at least partially on the first insulation film adjacent a lateral edge of the top surface, a second insulation film disposed on a side surface and a bottom surface of the semiconductor substrate, a metal wiring disposed on the second insulation film so as to be connected to a bottom portion of the metal pad and extending from the bottom surface to the side surface of the semiconductor substrate, a protection layer covering the metal wiring, and a conductive terminal connected to the metal wiring through an opening formed in the protection layer; and a second semiconductor device comprising a metal pad formed on a top surface thereof, wherein the first semiconductor device is stacked on the second semiconductor device so that the conductive terminal of the first semiconductor device is in contact with the metal pad of the second semiconductor device and that an edge portion of the protection layer is in contact with the top surface of the second semiconductor device.

5. A semiconductor device comprising:

a semiconductor substrate comprising a circuit element formed in a top surface thereof;

a first insulation film disposed on the top surface of the semiconductor substrate;

a metal pad connected to the circuit element and disposed at least partially on the first insulation film adjacent a lateral edge of the top surface;

a second insulation film disposed on a side surface and a bottom surface of the semiconductor substrate;

a metal wiring disposed on the second insulation film so as to be connected to a bottom portion of the metal pad, the metal wiring extending from the bottom surface to the side surface of the semiconductor substrate;

a protection layer disposed on the metal wiring;

a conductive terminal connected to the metal wiring through an opening formed in the protection layer; and a conductive film disposed on the protection layer so as to make a surface of the conductive film flat on the metal pad.

6. The semiconductor device of claim 5, further comprising a supporter bonded to the top surface of the semiconductor substrate so as to cover the top surface of the semiconductor substrate and the metal pad.

* * * * *